(12) United States Patent
Hennrich et al.

(10) Patent No.: US 11,622,458 B1
(45) Date of Patent: Apr. 4, 2023

(54) BRUSH PORT ASSEMBLY AND METHOD FOR INSTALLING SAME

(71) Applicant: CHATSWORTH PRODUCTS, INC., Agoura Hills, CA (US)

(72) Inventors: Preston Ellis Hennrich, Leander, TX (US); Jared Keith Davis, Leander, TX (US)

(73) Assignee: Chatsworth Products, Inc., Simi Valley, CA (US)

( * ) Notice: Subject to any disclaimer, the term of this patent is extended or adjusted under 35 U.S.C. 154(b) by 0 days.

(21) Appl. No.: 17/550,985

(22) Filed: Dec. 14, 2021

Related U.S. Application Data

(60) Provisional application No. 63/125,504, filed on Dec. 15, 2020.

(51) Int. Cl.
| H05K 5/02 | (2006.01) |
| H05K 5/03 | (2006.01) |
| H05K 7/14 | (2006.01) |

(52) U.S. Cl.
CPC ............. H05K 5/0247 (2013.01); H05K 5/03 (2013.01); H05K 7/1447 (2013.01)

(58) Field of Classification Search
None
See application file for complete search history.

(56) References Cited

U.S. PATENT DOCUMENTS

| 1,564,611 A | 12/1925 | Mountford et al. |
| 1,589,613 A | 6/1926 | Mountford et al. |
| 2,206,739 A | 7/1940 | Brogren et al. |
| 2,390,752 A | 12/1945 | Tinnerman |
| 2,406,415 A | 8/1946 | Tinnerman |

(Continued)

FOREIGN PATENT DOCUMENTS

| CN | 102177633 A | 9/2011 |
| CN | 108431433 A | 8/2018 |

(Continued)

OTHER PUBLICATIONS

Information Disclosure Statement (IDS) Letter Regarding Common Patent Application(s), dated Sep. 12, 2022.

(Continued)

*Primary Examiner* — Xanthia C Cunningham
(74) *Attorney, Agent, or Firm* — Tillman Wright, PLLC; James D. Wright; David R. Higgins

(57) ABSTRACT

A brush port assembly includes a bezel frame and a brush component. The bezel frame is comprised of an elongate body having first and second ends, a top surface, and an underside. The elongate body is formed as a generally enclosed shape that frames an opening, whereby the first and second ends are arranged in an end-to-end relationship with a gap therebetween. The brush component has a spine member from which a plurality of bristles extend. The spine member is secured to the underside of the elongate body such that the bristles substantially entirely cover the opening. The bezel frame is installable, without the aid of tools, along an exposed edge of a brush port opening in a surface of an electronic equipment enclosure. Additionally, the bezel frame is installable around a cable that passes through the brush port opening by maneuvering the cable through the gap.

17 Claims, 23 Drawing Sheets

(56) References Cited

U.S. PATENT DOCUMENTS

| | | |
|---|---|---|
| 2,426,799 A | 9/1947 | Tinnerman |
| 2,430,555 A | 11/1947 | Burke |
| 2,695,046 A | 11/1954 | Tinnerman, III |
| 2,724,419 A | 11/1955 | Poupitch |
| 2,875,804 A | 3/1959 | Flora |
| 3,019,409 A | 1/1962 | Sarafinas |
| 3,034,844 A | 5/1962 | Anderson et al. |
| 3,035,624 A | 5/1962 | Jaworski |
| 3,192,823 A | 7/1965 | Munse |
| 3,247,312 A | 4/1966 | Allessi |
| 3,404,931 A | 10/1968 | Fall et al. |
| 3,486,158 A | 12/1969 | Soltysik et al. |
| 3,563,627 A | 2/1971 | Whipps |
| 3,655,254 A | 4/1972 | Mayer et al. |
| 3,778,932 A | 12/1973 | Ewing |
| 3,810,069 A | 5/1974 | Jaconette, Jr. |
| 4,040,694 A | 8/1977 | Lascarrou |
| 4,045,104 A | 8/1977 | Peterson |
| 4,101,233 A | 7/1978 | McConnell |
| 4,417,366 A | 11/1983 | Salice |
| 4,473,166 A | 9/1984 | Breiter |
| 4,497,411 A | 2/1985 | DeBortoli |
| 4,553,674 A | 11/1985 | Yoshikawa et al. |
| 4,613,174 A | 9/1986 | Berg et al. |
| 4,620,392 A | 11/1986 | Kerpers et al. |
| 4,643,319 A | 2/1987 | Debus et al. |
| 4,723,749 A | 2/1988 | Carraro et al. |
| 4,796,541 A | 1/1989 | Halstrick |
| 4,803,756 A | 2/1989 | Hufnagel |
| 4,941,717 A | 7/1990 | Beaulieu |
| 4,966,563 A | 10/1990 | Pierce et al. |
| 4,974,289 A | 12/1990 | Piard |
| 4,993,959 A | 2/1991 | Randolph |
| 5,009,383 A | 4/1991 | Chapman |
| 5,020,866 A | 6/1991 | McIlwraith |
| 5,147,121 A | 9/1992 | McIlwraith |
| 5,165,770 A | 11/1992 | Hahn |
| 5,228,762 A | 7/1993 | Mascrier |
| RE34,393 E | 9/1993 | McIlwraith |
| 5,294,748 A | 3/1994 | Schwenk et al. |
| 5,372,262 A | 12/1994 | Benson et al. |
| 5,380,083 A | 1/1995 | Jones et al. |
| 5,388,903 A | 2/1995 | Jones et al. |
| 5,391,084 A | 2/1995 | Krietzman |
| 5,441,337 A | 8/1995 | Mazura et al. |
| 5,536,079 A | 7/1996 | Kostic |
| 5,561,886 A | 10/1996 | Flamme |
| 5,570,940 A | 11/1996 | Maro |
| 5,593,046 A | 1/1997 | Katsuura et al. |
| 5,624,319 A | 4/1997 | Golczyk et al. |
| 5,639,150 A | 6/1997 | Anderson et al. |
| 5,728,973 A | 3/1998 | Jorgensen |
| 5,788,351 A | 8/1998 | Prunty et al. |
| 5,791,498 A | 8/1998 | Mills |
| 5,806,945 A | 9/1998 | Anderson et al. |
| 5,864,922 A | 2/1999 | Kraft |
| 5,899,545 A | 5/1999 | Besserer et al. |
| 5,926,916 A | 7/1999 | Lee et al. |
| 5,927,368 A | 7/1999 | Rohrer et al. |
| 5,933,563 A | 8/1999 | Schaffer et al. |
| 5,938,302 A | 8/1999 | Anderson et al. |
| 5,940,937 A | 8/1999 | Churchill et al. |
| 5,954,525 A * | 9/1999 | Siegal .................... A47B 21/06 |
| | | 439/131 |
| 5,975,315 A | 11/1999 | Jordan |
| 5,983,590 A | 11/1999 | Serban |
| 5,991,975 A | 11/1999 | Baer |
| 5,997,117 A | 12/1999 | Krietzman |
| 6,000,769 A | 12/1999 | Chen |
| 6,000,771 A | 12/1999 | Wissinger et al. |
| 6,019,446 A | 2/2000 | Laboch et al. |
| 6,036,290 A | 3/2000 | Jancsek et al. |
| 6,082,878 A | 7/2000 | Doubek |
| 6,123,203 A | 9/2000 | Gibbons |
| 6,123,400 A | 9/2000 | Nicolai et al. |
| 6,152,554 A | 11/2000 | Parisi |
| 6,161,803 A | 12/2000 | Daoud |
| 6,185,098 B1 | 2/2001 | Benavides |
| 6,215,069 B1 | 4/2001 | Martin et al. |
| 6,220,554 B1 | 4/2001 | Daoud |
| 6,254,207 B1 | 7/2001 | Leneutre |
| 6,293,637 B1 | 9/2001 | Anderson et al. |
| 6,299,268 B1 | 10/2001 | Carle et al. |
| 6,321,917 B1 | 11/2001 | Mendoza |
| 6,348,655 B1 | 2/2002 | Wright |
| 6,365,834 B1 | 4/2002 | Larsen et al. |
| 6,401,940 B1 | 6/2002 | Hartel et al. |
| 6,425,488 B1 | 7/2002 | Notohardjono et al. |
| 6,425,648 B1 | 7/2002 | Notohardjono et al. |
| 6,427,952 B2 | 8/2002 | Caveney et al. |
| 6,428,127 B1 | 8/2002 | Rasmussen |
| 6,431,885 B1 | 8/2002 | Stroup |
| 6,467,633 B2 | 10/2002 | Mendoza |
| 6,468,112 B1 | 10/2002 | Follingstad et al. |
| 6,481,160 B1 | 11/2002 | Kowalczyk |
| 6,489,565 B1 | 12/2002 | Krietzman et al. |
| 6,501,899 B1 | 12/2002 | Marrs et al. |
| 6,502,702 B1 | 1/2003 | Hsue et al. |
| 6,504,100 B2 | 1/2003 | Lawrence et al. |
| 6,515,225 B1 | 2/2003 | Wright |
| 6,517,174 B2 | 2/2003 | Sevier |
| 6,527,351 B1 | 3/2003 | Sevier et al. |
| 6,535,681 B2 | 3/2003 | Daoud et al. |
| 6,541,705 B1 | 4/2003 | McGrath |
| 6,546,179 B2 | 4/2003 | Petri |
| 6,554,697 B1 | 4/2003 | Koplin |
| 6,561,602 B1 | 5/2003 | Sevier et al. |
| 6,565,166 B1 | 5/2003 | Bulk et al. |
| 6,584,267 B1 | 6/2003 | Caveney et al. |
| 6,605,782 B1 | 8/2003 | Krietzman et al. |
| 6,613,981 B1 | 9/2003 | Hathcock et al. |
| 6,614,978 B1 | 9/2003 | Caveney et al. |
| 6,632,999 B2 | 10/2003 | Sempliner et al. |
| 6,695,149 B1 | 2/2004 | Cote et al. |
| 6,712,434 B2 | 3/2004 | Knab et al. |
| 6,755,493 B1 | 6/2004 | Krietzman et al. |
| 6,760,531 B1 | 7/2004 | Solheid et al. |
| 6,762,360 B2 | 7/2004 | Wright |
| 6,791,841 B1 * | 9/2004 | Tirrell .................. H05K 5/0247 |
| | | 361/725 |
| 6,796,437 B2 | 9/2004 | Krampotich et al. |
| 6,808,240 B2 | 10/2004 | Altena |
| 6,814,244 B1 | 11/2004 | Hathcock |
| 6,883,879 B2 | 4/2005 | Latchinian |
| 6,884,942 B2 | 4/2005 | McGrath et al. |
| 6,915,616 B2 | 7/2005 | Fontana et al. |
| 6,918,796 B2 | 7/2005 | Elliot et al. |
| 6,946,605 B2 | 9/2005 | Levesque et al. |
| 6,951,288 B2 | 10/2005 | Henderson |
| 6,964,588 B2 | 11/2005 | Follingstad et al. |
| 6,968,647 B2 | 11/2005 | Levesque et al. |
| 6,976,292 B2 | 12/2005 | MacPherson et al. |
| 6,981,893 B2 | 1/2006 | Barker et al. |
| 6,992,247 B2 | 1/2006 | Rasmussen et al. |
| 7,000,784 B2 | 2/2006 | Canty et al. |
| 7,019,213 B1 | 3/2006 | McNutt et al. |
| 7,026,553 B2 | 4/2006 | Levesque et al. |
| 7,119,282 B2 | 10/2006 | Krietzman et al. |
| 7,144,320 B2 | 12/2006 | Turek et al. |
| 7,178,292 B2 | 2/2007 | Yamada |
| 7,178,679 B2 | 2/2007 | Canty et al. |
| 7,200,316 B2 | 4/2007 | Giraud et al. |
| 7,220,150 B2 | 5/2007 | Follingstad et al. |
| 7,225,586 B2 | 6/2007 | Levesque et al. |
| 7,226,260 B2 | 6/2007 | Jackson, Jr. et al. |
| 7,255,640 B2 | 8/2007 | Aldag et al. |
| 7,259,326 B2 | 8/2007 | Nguyen |
| 7,285,027 B2 | 10/2007 | McGrath et al. |
| 7,293,666 B2 | 11/2007 | Mattlin et al. |
| 7,316,461 B2 | 1/2008 | Wyatt et al. |
| 7,362,941 B2 | 4/2008 | Rinderer et al. |
| 7,378,046 B2 | 5/2008 | Canty et al. |
| 7,381,100 B2 | 6/2008 | Follingstad et al. |
| 7,417,188 B2 | 8/2008 | McNutt et al. |

(56) References Cited

U.S. PATENT DOCUMENTS

| | | |
|---|---|---|
| 7,425,678 B2 | 9/2008 | Adducci et al. |
| 7,427,713 B2 | 9/2008 | Adducci et al. |
| 7,438,638 B2 | 10/2008 | Lewis, II et al. |
| 7,458,859 B2 | 12/2008 | McGrath et al. |
| 7,472,970 B2 | 1/2009 | Bergesch et al. |
| 7,476,804 B2 | 1/2009 | Adducci et al. |
| 7,485,803 B2 | 2/2009 | Adducci et al. |
| 7,495,169 B2 | 2/2009 | Adducci et al. |
| 7,498,512 B2 | 3/2009 | Adducci et al. |
| 7,504,581 B2 | 3/2009 | Adducci et al. |
| 7,507,912 B1 | 3/2009 | Sempliner et al. |
| 7,542,287 B2 | 6/2009 | Lewis, II et al. |
| 7,547,228 B1 | 6/2009 | Schlarman |
| 7,592,541 B2 | 9/2009 | Adducci et al. |
| 7,608,779 B2 | 10/2009 | Adducci et al. |
| 7,637,771 B2 | 12/2009 | Laursen |
| 7,667,135 B2 | 2/2010 | Adducci et al. |
| 7,697,285 B2 | 4/2010 | Donowho et al. |
| 7,718,889 B2 | 5/2010 | Rasmussen et al. |
| 7,718,891 B2 | 5/2010 | Adducci et al. |
| 7,746,637 B2 | 6/2010 | Donowho et al. |
| 7,762,405 B2 | 7/2010 | Vogel et al. |
| 7,764,495 B2 | 7/2010 | Hruby et al. |
| 7,772,489 B2 | 8/2010 | Adducci et al. |
| 7,778,513 B2 | 8/2010 | Rinderer et al. |
| 7,781,675 B2 | 8/2010 | Adducci et al. |
| 7,789,606 B2 | 9/2010 | Kosidlo, IV et al. |
| 7,795,532 B2 | 9/2010 | Walker |
| 7,804,685 B2 | 9/2010 | Krietzman |
| 7,823,846 B2 | 11/2010 | Williams, III |
| 7,839,635 B2 | 11/2010 | Donowho et al. |
| 7,880,084 B2 | 2/2011 | Adducci et al. |
| 7,893,356 B2 | 2/2011 | Garza et al. |
| 7,894,190 B2 | 2/2011 | Davis et al. |
| 7,952,869 B2 | 5/2011 | Lewis, II et al. |
| 7,957,139 B2 | 6/2011 | Davis et al. |
| 7,973,242 B2 | 7/2011 | Jones et al. |
| 7,999,183 B2 | 8/2011 | Garza et al. |
| 8,035,965 B2 | 10/2011 | Adducci et al. |
| 8,040,673 B2 | 10/2011 | Krietzman |
| 8,049,109 B2 | 11/2011 | Sempliner et al. |
| 8,107,238 B2 | 1/2012 | Krietzman et al. |
| 8,138,419 B2 | 3/2012 | Garza et al. |
| 8,235,634 B2 | 8/2012 | Larsen et al. |
| 8,237,052 B2 | 8/2012 | Adducci et al. |
| 8,263,867 B2 | 9/2012 | Garza et al. |
| 8,273,989 B2 | 9/2012 | Garza et al. |
| 8,281,940 B2 | 10/2012 | Fan |
| 8,317,274 B2 | 11/2012 | Hsiao |
| 8,330,043 B2 | 12/2012 | Alaniz et al. |
| 8,395,046 B2 | 3/2013 | Nicewicz et al. |
| 8,405,984 B2 | 3/2013 | Donowho et al. |
| 8,424,691 B2 | 4/2013 | McMillan, III et al. |
| 8,443,987 B2 | 5/2013 | Peng et al. |
| 8,459,918 B2 | 6/2013 | Lin et al. |
| 8,556,357 B2 | 10/2013 | Fan |
| 8,628,158 B2 | 1/2014 | Caveney |
| 8,653,363 B2 | 2/2014 | Behrens et al. |
| 8,683,762 B2 * | 4/2014 | Rodriquez .......... E04B 5/48 52/220.8 |
| 8,730,665 B2 | 5/2014 | Lewis, II et al. |
| 8,737,068 B2 | 5/2014 | Krietzman et al. |
| 8,746,466 B2 | 6/2014 | Taylor |
| 8,787,023 B2 | 7/2014 | Lewis, II et al. |
| 8,844,888 B1 | 9/2014 | Gretz |
| 8,867,206 B2 | 10/2014 | Hruby et al. |
| 8,879,881 B2 | 11/2014 | Cote et al. |
| 8,901,438 B2 | 12/2014 | Lewis, II et al. |
| 8,973,951 B2 | 3/2015 | Nicewicz |
| 9,055,677 B2 | 6/2015 | Garza, Jr. et al. |
| 9,084,369 B2 | 7/2015 | Lewis, II et al. |
| 9,119,329 B2 | 8/2015 | Krietzman et al. |
| 9,210,833 B2 | 12/2015 | Caveney et al. |
| 9,332,863 B2 | 5/2016 | Ramey et al. |
| 9,351,427 B2 | 5/2016 | Lewis, II et al. |
| 9,408,326 B2 | 8/2016 | Lewis, II et al. |
| 9,420,727 B2 | 8/2016 | Lewis, II et al. |
| 9,548,597 B2 | 1/2017 | Vacca et al. |
| 9,549,487 B2 | 1/2017 | Lewis, II et al. |
| 9,572,286 B2 | 2/2017 | Greeson et al. |
| 9,627,860 B2 | 4/2017 | Proserpio et al. |
| 9,642,270 B2 | 5/2017 | Lewis, II et al. |
| 9,781,852 B2 | 10/2017 | Garza, Jr. et al. |
| 9,795,060 B2 | 10/2017 | Greeson et al. |
| 9,801,309 B2 | 10/2017 | Krietzman et al. |
| 9,814,159 B2 | 11/2017 | Lewis, II et al. |
| 9,949,406 B2 | 4/2018 | Lewis, II et al. |
| 9,974,198 B2 | 5/2018 | Lewis, II et al. |
| 9,980,400 B2 | 5/2018 | Lewis, II et al. |
| 10,123,462 B2 | 11/2018 | Krietzman et al. |
| 10,178,784 B2 | 1/2019 | Lewis, II et al. |
| 10,237,994 B2 | 3/2019 | Donowho et al. |
| 10,271,452 B2 | 4/2019 | Hennrich et al. |
| 10,334,761 B2 | 6/2019 | Krietzman et al. |
| 10,337,550 B2 | 7/2019 | Davis et al. |
| 10,356,951 B2 | 7/2019 | Lewis, II et al. |
| 10,440,847 B2 | 10/2019 | Lewis, II et al. |
| 10,477,720 B2 | 11/2019 | Hennrich et al. |
| 10,568,239 B2 | 2/2020 | Krietzman et al. |
| 10,588,227 B2 | 3/2020 | Donowho et al. |
| 10,595,442 B2 | 3/2020 | Davis |
| 10,624,232 B2 | 4/2020 | Krietzman |
| 10,653,025 B2 | 5/2020 | Garza et al. |
| 10,674,634 B2 | 6/2020 | Lewis, II et al. |
| 10,765,037 B2 | 9/2020 | Lewis, II et al. |
| 10,791,640 B2 | 9/2020 | Lewis, II et al. |
| 10,859,111 B2 | 12/2020 | Davis |
| 11,039,543 B2 | 6/2021 | Donowho et al. |
| 11,071,227 B2 | 7/2021 | Hennrich et al. |
| 11,083,108 B2 | 8/2021 | Lewis, II et al. |
| 11,162,615 B2 | 11/2021 | Hennrich et al. |
| 11,209,039 B2 | 12/2021 | Davis et al. |
| 11,212,928 B2 | 12/2021 | Lewis, II et al. |
| 11,268,636 B2 | 3/2022 | Hennrich et al. |
| 11,342,730 B1 | 5/2022 | Thompson et al. |
| 11,464,123 B2 | 10/2022 | Garza, Jr. et al. |
| 11,464,132 B2 | 10/2022 | Krietzman |
| 11,493,151 B2 | 11/2022 | Hennrich et al. |
| 2002/0046979 A1 | 4/2002 | Larsen et al. |
| 2002/0074149 A1 | 6/2002 | Lawrence et al. |
| 2002/0149911 A1 | 10/2002 | Bishop et al. |
| 2002/0172013 A1 | 11/2002 | Chandler |
| 2003/0020379 A1 | 1/2003 | Larsen et al. |
| 2003/0034717 A1 | 2/2003 | Yao |
| 2003/0079897 A1 * | 5/2003 | Sempliner .......... F16L 5/00 174/650 |
| 2003/0226238 A1 | 12/2003 | Baer |
| 2004/0016713 A1 | 1/2004 | Wyatt et al. |
| 2004/0020873 A1 | 2/2004 | Henderson |
| 2004/0050808 A1 | 3/2004 | Krampotich et al. |
| 2004/0154818 A1 | 8/2004 | Franks, Jr. |
| 2004/0181916 A1 | 9/2004 | Arduini |
| 2004/0183409 A1 | 9/2004 | Rinderer |
| 2004/0190270 A1 | 9/2004 | Aldag et al. |
| 2004/0201335 A1 | 10/2004 | Davis |
| 2005/0247650 A1 | 11/2005 | Vogel et al. |
| 2006/0103270 A1 | 5/2006 | Bergesch et al. |
| 2006/0141921 A1 | 6/2006 | Turek et al. |
| 2007/0064389 A1 | 3/2007 | Lewis, II et al. |
| 2007/0064391 A1 | 3/2007 | Lewis, II et al. |
| 2007/0210679 A1 | 9/2007 | Adducci et al. |
| 2007/0210680 A1 | 9/2007 | Appino et al. |
| 2007/0210681 A1 | 9/2007 | Adducci et al. |
| 2007/0210683 A1 | 9/2007 | Adducci et al. |
| 2007/0210686 A1 | 9/2007 | Adducci et al. |
| 2007/0221393 A1 | 9/2007 | Adducci et al. |
| 2007/0249237 A1 | 10/2007 | Follingstad et al. |
| 2007/0257159 A1 | 11/2007 | Nelson et al. |
| 2007/0293138 A1 | 12/2007 | Adducci et al. |
| 2008/0035810 A1 | 2/2008 | Lewis, II |
| 2008/0037228 A1 | 2/2008 | Lewis, II |
| 2008/0062654 A1 | 3/2008 | Mattlin et al. |
| 2008/0067904 A1 | 3/2008 | Adducci et al. |
| 2008/0074849 A1 | 3/2008 | Adducci et al. |

(56) References Cited

U.S. PATENT DOCUMENTS

| | | |
|---|---|---|
| 2008/0130262 A1 | 6/2008 | Rinderer et al. |
| 2008/0141495 A1 | 6/2008 | Fisher |
| 2008/0155915 A1 | 7/2008 | Howe et al. |
| 2008/0174217 A1 | 7/2008 | Walker |
| 2008/0266789 A1 | 10/2008 | Hruby et al. |
| 2008/0289873 A1 | 11/2008 | Herring et al. |
| 2008/0316702 A1 | 12/2008 | Donowho et al. |
| 2008/0316703 A1 | 12/2008 | Donowho et al. |
| 2009/0014614 A1 | 1/2009 | Warmoth et al. |
| 2009/0059523 A1 | 3/2009 | Mallia et al. |
| 2009/0061755 A1 | 3/2009 | Calder et al. |
| 2009/0093169 A1 | 4/2009 | McGrath et al. |
| 2009/0129013 A1 | 5/2009 | Donowho et al. |
| 2009/0151983 A1* | 6/2009 | Sempliner ............... H02G 3/22 174/153 G |
| 2009/0165250 A1 | 7/2009 | Duan et al. |
| 2009/0190307 A1 | 7/2009 | Krietzman |
| 2009/0227197 A1 | 9/2009 | Lewis, II et al. |
| 2009/0236117 A1 | 9/2009 | Garza et al. |
| 2009/0239461 A1 | 9/2009 | Lewis, II et al. |
| 2009/0283488 A1 | 11/2009 | McMillan, III et al. |
| 2010/0003911 A1 | 1/2010 | Graczyk et al. |
| 2010/0061059 A1 | 3/2010 | Krietzman et al. |
| 2010/0084188 A1 | 4/2010 | Rajvanshi et al. |
| 2010/0096105 A1 | 4/2010 | Novotny et al. |
| 2010/0096962 A1 | 4/2010 | Rajvanshi et al. |
| 2010/0101820 A1 | 4/2010 | Alaniz et al. |
| 2010/0122830 A1 | 5/2010 | Garza et al. |
| 2010/0126750 A1 | 5/2010 | Garza et al. |
| 2010/0126751 A1 | 5/2010 | Garza et al. |
| 2010/0172092 A1 | 7/2010 | Davis et al. |
| 2010/0172093 A1 | 7/2010 | Davis et al. |
| 2010/0193241 A1 | 8/2010 | Bennett et al. |
| 2010/0193754 A1 | 8/2010 | Garza et al. |
| 2010/0200707 A1 | 8/2010 | Garza et al. |
| 2010/0243315 A1 | 9/2010 | Shumate et al. |
| 2011/0001408 A1 | 1/2011 | Caveney et al. |
| 2011/0019362 A1 | 1/2011 | Krietzman |
| 2011/0083873 A1* | 4/2011 | Hartman ................ H04Q 1/06 174/66 |
| 2011/0100668 A1 | 5/2011 | Syed |
| 2011/0148261 A1 | 6/2011 | Donowho et al. |
| 2011/0173906 A1* | 7/2011 | Reddicliffe ....... E04F 15/02405 52/220.8 |
| 2011/0278060 A1 | 11/2011 | Rajvanshi et al. |
| 2011/0278999 A1 | 11/2011 | Caveney et al. |
| 2011/0287704 A1 | 11/2011 | Lewis, II et al. |
| 2011/0290553 A1 | 12/2011 | Behrens et al. |
| 2011/0308179 A1* | 12/2011 | Pirner ..................... E04B 9/003 52/220.8 |
| 2012/0012543 A1 | 1/2012 | Fan |
| 2012/0013229 A1 | 1/2012 | Krietzman |
| 2012/0043869 A1 | 2/2012 | Liu et al. |
| 2012/0049706 A1 | 3/2012 | Cottuli et al. |
| 2012/0062083 A1 | 3/2012 | Lewis, II et al. |
| 2012/0062084 A1 | 3/2012 | Lewis, II et al. |
| 2012/0062086 A1* | 3/2012 | Garza, Jr. ............ H05K 7/1488 312/352 |
| 2012/0062091 A1 | 3/2012 | Donowho et al. |
| 2012/0063099 A1 | 3/2012 | Alaniz et al. |
| 2012/0080984 A1 | 4/2012 | Watts |
| 2012/0181906 A1 | 7/2012 | Caveney |
| 2012/0194999 A1 | 8/2012 | Krietzman et al. |
| 2012/0244729 A1 | 9/2012 | Rivera et al. |
| 2012/0267991 A1 | 10/2012 | Adducci et al. |
| 2012/0279779 A1* | 11/2012 | Cottuli ................. H02G 3/185 174/660 |
| 2012/0305307 A1 | 12/2012 | Korcz et al. |
| 2013/0069501 A1 | 3/2013 | Liu |
| 2014/0132134 A1 | 5/2014 | Garza, Jr. et al. |
| 2014/0265774 A1 | 9/2014 | Stewart, Jr. et al. |
| 2014/0319084 A1 | 10/2014 | Lewis, II et al. |
| 2014/0323029 A1 | 10/2014 | Lewis, II et al. |
| 2014/0334099 A1 | 11/2014 | Krietzman et al. |
| 2015/0008810 A1 | 1/2015 | Ivey et al. |
| 2015/0030300 A1 | 1/2015 | Terry et al. |
| 2015/0065028 A1 | 3/2015 | Krietzman |
| 2015/0069888 A1 | 3/2015 | Lewis, II et al. |
| 2015/0136714 A1 | 5/2015 | Franklin |
| 2015/0173253 A1 | 6/2015 | Lewis, II et al. |
| 2015/0250071 A1 | 9/2015 | Garza, Jr. et al. |
| 2015/0264839 A1 | 9/2015 | Lewis, II et al. |
| 2015/0282390 A1 | 10/2015 | Lewis, II et al. |
| 2015/0319872 A1 | 11/2015 | Lewis, II et al. |
| 2015/0333303 A1 | 11/2015 | Hachiya et al. |
| 2015/0342082 A1 | 11/2015 | Roehrl et al. |
| 2015/0351289 A1 | 12/2015 | Krietzman et al. |
| 2015/0366094 A1 | 12/2015 | Segroves et al. |
| 2016/0262277 A1 | 9/2016 | Lewis, II et al. |
| 2016/0302317 A1 | 10/2016 | Lewis, II et al. |
| 2017/0127569 A1 | 5/2017 | Rimler et al. |
| 2017/0127570 A1 | 5/2017 | Lewis, II et al. |
| 2017/0150652 A1 | 5/2017 | Greeson et al. |
| 2017/0167523 A1 | 6/2017 | Davis et al. |
| 2017/0223864 A1 | 8/2017 | Jost et al. |
| 2017/0223865 A1 | 8/2017 | Lewis, II et al. |
| 2017/0290181 A1 | 10/2017 | Donowho et al. |
| 2017/0331269 A1 | 11/2017 | Hansen |
| 2017/0332501 A1 | 11/2017 | Lewis, II et al. |
| 2018/0027677 A1 | 1/2018 | Garza, Jr. et al. |
| 2018/0042143 A1 | 2/2018 | Krietzman et al. |
| 2018/0110153 A1 | 4/2018 | Hennrich et al. |
| 2018/0228056 A1 | 8/2018 | Lewis, II et al. |
| 2018/0263127 A1 | 9/2018 | Lewis, II et al. |
| 2018/0270968 A1 | 9/2018 | Lewis, II et al. |
| 2019/0063483 A1 | 2/2019 | Davis |
| 2019/0098791 A1 | 3/2019 | Hennrich et al. |
| 2019/0098792 A1 | 3/2019 | Hennrich et al. |
| 2019/0215973 A1 | 7/2019 | Donowho et al. |
| 2019/0313551 A1 | 10/2019 | Krietzman et al. |
| 2019/0343023 A1 | 11/2019 | Lewis, II et al. |
| 2020/0077534 A1 | 3/2020 | Hennrich et al. |
| 2020/0113074 A1 | 4/2020 | Lewis, II et al. |
| 2020/0187387 A1 | 6/2020 | Lewis, II et al. |
| 2020/0196465 A1 | 6/2020 | Donowho et al. |
| 2020/0245494 A1 | 7/2020 | Krietzman |
| 2020/0275569 A1 | 8/2020 | Garza, Jr. et al. |
| 2020/0288605 A1 | 9/2020 | Lewis, II et al. |
| 2020/0367381 A1 | 11/2020 | Hennrich et al. |
| 2020/0367382 A1 | 11/2020 | Hennrich et al. |
| 2020/0383230 A1 | 12/2020 | Hennrich et al. |
| 2020/0396868 A1 | 12/2020 | Lewis, II et al. |
| 2021/0014988 A1 | 1/2021 | Lewis, II et al. |
| 2021/0079944 A1 | 3/2021 | Davis |
| 2021/0307183 A1 | 9/2021 | Donowho et al. |
| 2021/0329808 A1 | 10/2021 | Hennrich et al. |
| 2021/0385976 A1 | 12/2021 | Lewis, II et al. |
| 2022/0034430 A1 | 2/2022 | Hennrich et al. |
| 2022/0099133 A1 | 3/2022 | Davis |
| 2022/0124924 A1 | 4/2022 | Lewis, II et al. |
| 2022/0183190 A1 | 6/2022 | Lewis, II et al. |
| 2022/0235883 A1 | 7/2022 | Hennrich et al. |

FOREIGN PATENT DOCUMENTS

| | | |
|---|---|---|
| CN | ZL201680073061.8 | 5/2021 |
| DE | 20207426 U1 | 9/2002 |
| EP | 2205054 A1 | 7/2010 |
| EP | 2429271 | 3/2012 |
| EP | 2429272 | 3/2012 |
| FR | 1402979 A | 6/1965 |
| FR | 2794501 A1 | 12/2000 |
| GB | 981072 A | 1/1965 |
| GB | 2366084 B | 9/2002 |
| JP | H8-8-187537 | 7/1996 |
| JP | 2019-502069 | 1/2019 |
| JP | 7066618 | 5/2022 |
| SE | 535066 C2 | 4/2012 |
| WO | 1999048305 | 9/1999 |
| WO | 2001001533 A1 | 1/2001 |
| WO | 2001001534 A1 | 1/2001 |
| WO | 2005112477 A1 | 11/2005 |
| WO | 2006055506 A2 | 5/2006 |

(56) References Cited

FOREIGN PATENT DOCUMENTS

| WO | 2008022058 A2 | 2/2008 |
| WO | 2008022058 A3 | 11/2008 |
| WO | 2009089306 A1 | 7/2009 |
| WO | 2009103090 A2 | 8/2009 |
| WO | 2009103090 A3 | 10/2009 |
| WO | 2010028384 A2 | 3/2010 |
| WO | 2010028384 A3 | 5/2010 |
| WO | 2009089306 A4 | 6/2011 |
| WO | 2017105840 A1 | 6/2017 |
| WO | 2018022721 A1 | 2/2018 |

OTHER PUBLICATIONS

Information Disclosure Statement (IDS) Letter Regarding Common Patent Application(s), dated Mar. 16, 2022.

Chatsworth Products, Inc., "Thermal Management Solutions," Signature Solutions Brochure, available at Internet Web Page <www.chatsworth.com/passivecooling>, dated Mar. 2008 (6 pages).

Emerson Network Power, Smart Cooling Solutions Data Center, Oct. 2012, Internet Web Page <http://www.emersonnetworkpower.com/en-EMEA/Products/RACKSANDINTEGRATEDCABINETS/Documents/Knur%20DCD/Smart-Cooling-Solutions-Data-Center-EN.pdf> (51 pages).

Hewlett-Packard Development Company, LP, HP 10000 G2 42U Rack Air Duct Installation Guide, dated Aug. 2008 (23 pages).

Panduit Corporation, Panduit Net-Access Vertical Exhaust Duct (VED) Instructions, dated 2009 (4 pages).

Panduit Corporation, Panduit Net-Access Vertical Exhaust System (VES) Specification Sheet, dated 2011 (4 pages).

Rack Technologies PTY LTD, Product Catalog, Internet Web Page <http://racktechnologies.com.au/files/rt2005.pdf>, Jun. 16, 2005, retrieved from Internet Archive Wayback Machine <http://web.archive.org/web/20050616212856/http://racktechnologies.com.au/files/rt2005.pdf> as reviewed as of Apr. 29, 2016 (73 pages).

Eaton Corporation, Eaton Airflow Management Solutions: Installation Guide for Telescopic Chimney for SSeries Enclosures, Publication No. MN160007EN, dated 2014 (13 pages).

Eaton Corporation, Data Center Products: Eaton Telescopic Chimney, dated 2014 (2 pages).

Panduit Corporation, Panduit Vertical Exhaust Duct for N-Type and S-Type Cabinets: Installation Instructions, dated 2012 (14 pages).

"European Search Report" European Patent Application No. 11275109.4 for Chatsworth Products Inc., dated Sep. 18, 2014 (5 pages).

Information Disclosure Statement (IDS) Letter Regarding Common Patent Application(s), dated Dec. 12, 2022.

\* cited by examiner

*prior art* prior art prior art

BRUSH PORT ASSEMBLY AND METHOD FOR INSTALLING SAME

CROSS-REFERENCE TO RELATED APPLICATIONS

The present application is a U.S. nonprovisional patent application of, and claims priority under 35 U.S.C. § 119(e) to, U.S. provisional patent application Ser. No. 63/125,504, filed Dec. 15, 2020, which '504 application is incorporated by reference herein in its entirety. Additionally, the entirety of each of the following commonly-assigned U.S. provisional patent applications is incorporated herein by reference:
(a) U.S. provisional patent application Ser. No. 63/125,489, filed Dec. 15, 2020 and entitled, "SLIDABLE MOUNTING HARDWARE FOR ELECTRONIC EQUIPMENT ENCLOSURE," attached hereto as Appendix A;
(b) U.S. provisional patent application Ser. No. 63/125,499, filed Dec. 15, 2020 and entitled, "CASTER ATTACHMENT SYSTEM USING MATING FEATURES," attached hereto as Appendix B;
(c) U.S. provisional patent application Ser. No. 63/125,506, filed Dec. 15, 2020 and entitled, "FRAME STRUCTURE FOR ELECTRONIC EQUIPMENT ENCLOSURE," attached hereto as Appendix C; and The disclosure of each of the foregoing U.S. provisional patent applications is contained in the corresponding appendix, as designated above, each of which is likewise incorporated herein in its entirety by reference and is intended to provide background and technical information with regard to the systems and environments of the inventions of the current nonprovisional patent application.

COPYRIGHT STATEMENT

All of the material in this patent document is subject to copyright protection under the copyright laws of the United States and other countries. The copyright owner has no objection to the facsimile reproduction by anyone of the patent document or the patent disclosure, as it appears in official governmental records but, otherwise, all other copyright rights whatsoever are reserved.

BACKGROUND OF THE PRESENT INVENTION

Field of the Present Invention

The present invention relates generally to ports for electronic equipment accessories, enclosures, and the like, and, in particular, to ports adapted to accommodate a brush.

Background

Equipment enclosures, such as frames, cabinets, and the like for supporting computer and other electronic equipment, are very well known. Such equipment enclosures are often partially or fully enclosed, either directly or through the use of doors and panels mounted directly thereon. These doors and panels make it possible to better manage cooling and airflow within the enclosures by segregating heated exhaust air from cool air being supplied to components mounted therein. In addition, airflow and hot/cool air segregation within the enclosures is often accomplished using a variety of internal structures, such as air dams, baffles, panels, and the like.

However, it is usually necessary to provide openings in at least some of the exterior doors and panels and/or interior structures to permit cables and other components to be routed therethrough. Unfortunately, these openings naturally allow air to leak through, particularly when they are only partially filled with cables. Furthermore, because the size and location of the openings are typically not customized for a particular installation, many cable pass-through openings go unused. Still further, the number and size of cables passing through a particular opening may change from time to time. Because of these issues, a variety of devices have been developed to block unused openings or portions thereof in order to better manage airflow and the cooling/exhaust of air to and from enclosures.

One device that is commonly used to minimize unwanted airflow through an opening is depicted in FIG. 1, which is an isometric view of a prior art split brush port assembly 2, and FIG. 2, which is an isometric view of four of the prior art split brush port assemblies 2 of FIG. 1 shown mounted in a top panel 1 for an electronic equipment enclosure (not shown). Each split brush port assembly 2 utilizes left and right halves 3,4, each including a brush component. Each brush component includes a length of deflectable resilient bristles that naturally block the opening except where pushed aside by cables or the like that are routed through the opening. Another known type of brush port assembly is depicted in FIG. 3, which is an isometric view of a prior art multi-piece brush port assembly 5. Along with a brush component 6, the multi-piece brush port assembly 5 includes a pair of long edge components 7 and a pair of short edge components 8, wherein the brush component 6 is supported by one of the long edge components 7. The edge components 7,8 extend along exposed edges of the opening in the panel or other structure to provide protection for cables and wiring that extends through the opening.

Unfortunately, these well-known types of brush port assemblies used in connection with equipment accessories and cabinets require installation of multiple different components in order to facilitate being installed around existing wiring. For example, the halves 3, 4 of the assembly 2 of FIG. 1 are separately mountable at opposite sides of an opening to permit the split brush port assembly 2 being installed around existing wiring while the multi-piece construction of the assembly 5 of FIG. 3 facilitates installation of the brush port assembly 5 around existing wiring.

Other types of known brush port assemblies are unable to be installed at an opening through which cables or wiring are already present. In this regard, FIG. 4 is an isometric view of four other prior art brush port assemblies 9 mounted in a top panel 1 for an electronic equipment enclosure (not shown). This type of brush port assembly 9 utilizes a single, continuous frame component that extends fully around the opening in the panel or other structure. Because of the closed-loop nature of the single frame, installation of this type of brush port assembly necessitates disassembly and/or removal of any existing cables or wiring as part of the installation process.

As such, a need exists for a brush port assembly that facilitates installation, and preferably toolless installation, of the assembly in openings where cables or wiring is already present. This and/or other needs are addressed by one or more aspects of the present invention.

SUMMARY OF THE PRESENT INVENTION

Some exemplary embodiments of the present invention may overcome one or more of the above disadvantages and other disadvantages not described above, but the present invention is not required to overcome any particular disadvantage described above, and some exemplary embodiments of the present invention may not overcome any of the disadvantages described above.

The present invention includes many aspects and features. Moreover, while many aspects and features relate to, and are described in, the context of pass-through ports for electronic equipment accessories, enclosures, and the like, the present invention is not limited to use only in pass-through ports for electronic equipment accessories, enclosures, and the like, as will become apparent from the following summaries and detailed descriptions of aspects, features, and one or more embodiments of the present invention Broadly defined, the present invention according to one aspect relates to a brush port assembly. The brush port assembly includes a bezel having a single-piece construction and defining an opening therethrough. The bezel has a discontinuous perimeter such that a gap is formed between adjacent ends. The brush port assembly further includes a brush component mounted to an underside of the bezel. The bezel includes one or more features to facilitate installation, without the aid of tools, along an edge of an opening in a surface of an electronic equipment enclosure. The bezel is adapted to accommodate passage of a cable through the gap and into the opening.

In a feature of this aspect, the bezel includes rounded edges.

In another feature of this aspect, the brush port assembly further includes one or more brush clamps that secure the brush component to the underside of the bezel. In another feature of this aspect, each brush clamp is anchored with a separate fastener.

In another feature of this aspect, each brush clamp is formed of sheet metal. In another feature of this aspect, the separate fasteners include rivets.

In another feature of this aspect, each brush clamp is a plastic clip.

In another feature of this aspect, the bezel includes a pair of hooks and a plurality of tabs that extend from the underside thereof.

In another feature of this aspect, each hook includes: a proximal portion that extends downward in a direction that is transverse to an outer edge of the bezel; and a distal portion that extends in a direction that is angled outward and downward.

In another feature of this aspect, each tab includes a triangular wedge at a distal end thereof. In another feature of this aspect, each tab is a deflectable tab.

In another feature of this aspect, the bezel includes an inner sleeve that enters into abutment with the edge of the opening when the brush port assembly is installed.

In another feature of this aspect, one or both of the adjacent ends of the bezel are bendable to facilitate accommodation of the cable through the gap.

In another feature of this aspect, the bezel has a generally rectangular shape.

In another feature of this aspect, the surface is part of an equipment mounting rail installed in the electronic equipment enclosure.

In another feature of this aspect, the surface is part of a panel of the electronic equipment enclosure.

Broadly defined, the present invention according to another aspect relates to a method of installing a brush port assembly in an electronic equipment enclosure without the aid of tools. The method includes: providing a brush port assembly having a generally rectangular bezel and a brush component mounted thereto, wherein the bezel defines an opening therethrough and includes a hook and a plurality of tabs that extend from an underside thereof; positioning the brush port assembly relative to a generally rectangular opening in an electronic equipment enclosure such that the hook engages an edge of the opening; rotating the brush port assembly toward the opening such that distal ends of the tabs engage edges of the opening; and applying a force against the brush port assembly to cause the distal ends of the tabs to be deflected inward by edges of the opening by a distance that is sufficient to clear the opening, upon which the tabs return to an deflected state and thereby securing the brush port assembly to the electronic equipment enclosure.

In a feature of this aspect, the bezel has a single-piece construction.

In another feature of this aspect, the bezel has a discontinuous perimeter such that a gap is formed between adjacent ends. In another feature of this aspect, the method further includes positioning a previously-installed cable through the gap. In another feature of this aspect, one or both of the exposed ends are bendable to facilitate accommodation of the cable through the gap.

In another feature of this aspect, each tab includes a triangular wedge at the distal end thereof.

In another feature of this aspect, the bezel includes an inner sleeve that enters into abutment with edges of the opening.

In another feature of this aspect, the opening is arranged on a surface of an equipment mounting rail.

In another feature of this aspect, the opening is arranged on a surface of a panel.

Broadly defined, the present invention according to another aspect relates to a brush port assembly substantially as shown and described.

Broadly defined, the present invention according to another aspect relates to a method for installing a brush port assembly substantially as shown and described.

Broadly defined, the present invention according to another aspect relates to an electronic equipment enclosure comprising a brush port assembly substantially as shown and described installed therein or thereon.

Broadly defined, the present invention according to another aspect relates to a brush port assembly. The brush port assembly includes a bezel frame and a brush component. The bezel frame is comprised of an elongate body having first and second ends, a top surface, and an underside. The elongate body is formed as a generally enclosed shape that frames an opening, whereby the first and second ends are arranged in an end-to-end relationship with a gap therebetween. The brush component has a spine member from which a plurality of bristles extend. The spine member is secured to the underside of the elongate body such that the bristles substantially entirely cover the opening. The bezel frame is installable, without the aid of tools, along an exposed edge of a brush port opening in a surface of an electronic equipment enclosure. The bezel frame is installable around a cable that passes through the brush port opening by maneuvering the cable through the gap.

In a feature of this aspect, the top surface of the elongate body is a smooth surface having rounded edges.

In another feature of this aspect, the brush port assembly further includes one or more brush clamps, each of which is anchored to the underside of the elongate body with a separate fastener.

In another feature of this aspect, the bezel frame includes a plurality of hooks for hooking against the exposed edge of the brush port opening during installation. In another feature of this aspect, each hook includes a proximal portion that extends downward from the underside of the elongate body and a distal portion that extends from the proximal portion at an angle downward and away from the opening. In another feature of this aspect, the proximal portions extend downward from locations at the underside of the elongate body that are inset from an outer edge of the elongate body.

In another feature of this aspect, the bezel frame includes a plurality of deflectable tabs that extend downward from the underside of the elongate body, each of the deflectable tabs including a wedge at a distal end to facilitate snap-fitting of the bezel frame against the surface.

In another feature of this aspect, the bezel frame includes a sleeve that extends downward from an inner edge of the elongate body that enters into abutment with the exposed edge of the brush port opening during installation.

In another feature of this aspect, one or both of the first and second ends of the elongate body are deflectable to facilitate accommodation of the cable through the gap.

In another feature of this aspect, the generally enclosed shape is generally rectangular.

Broadly defined, the present invention according to another aspect relates to a brush port assembly. The brush port assembly includes a bezel frame and a brush component. The bezel frame is comprised of an elongate body having first and second ends, a top surface, and an underside. The elongate body is formed as a generally enclosed shape that frames an opening, whereby the first and second ends are arranged in an end-to-end relationship with a gap therebetween. The brush component has a spine member from which a plurality of bristles extend. The spine member is secured to the underside of the elongate body such that the bristles substantially entirely cover the opening. The bezel frame includes a plurality of hooks, each hook including a proximal portion that extends downward from the underside of the elongate body and a distal portion that extends from the proximal portion at an angle downward and away from the opening. The bezel frame includes a plurality of deflectable tabs that extend downward from the underside of the elongate body, each of the deflectable tabs including a wedge at a distal end.

In a feature of this aspect, the top surface of the elongate body is a smooth surface having rounded edges.

In another feature of this aspect, the brush port assembly further includes one or more brush clamps, each of which is anchored to the underside of the elongate body with a separate fastener.

In another feature of this aspect, the proximal portions extend downward from locations at the underside of the elongate body that are inset from an outer edge of the elongate body.

In another feature of this aspect, the bezel frame includes a sleeve that extends downward from an inner edge of the elongate body.

In another feature of this aspect, one or both of the first and second ends of the elongate body are deflectable.

In another feature of this aspect, the generally enclosed shape is generally rectangular.

Broadly defined, the present invention according to another aspect relates to a method of installing a brush port assembly at a brush port opening having a cable passing therethrough. The method includes: providing a brush port assembly including a bezel frame having an elongate body formed as a generally enclosed shape that defines a frame opening and including a plurality of bristles that substantially entirely covers the frame opening, the elongate body having first and second ends arranged in an end-to-end relationship with a gap therebetween; positioning the cable through the gap so that the cable passes into the frame opening and is at least substantially surrounded by at least a portion of the plurality of bristles; and securing the brush port assembly against the brush port opening.

In a feature of this aspect, a top surface of the elongate body is a smooth surface having rounded edges.

In another feature of this aspect, one or both of the first and second ends of the elongate body are deflectable to facilitate accommodation of the cable through the gap.

In another feature of this aspect, the generally enclosed shape is generally rectangular.

In another feature of this aspect, the brush port opening is located on a surface of an equipment mounting rail installed in an electronic equipment enclosure.

In another feature of this aspect, the brush port opening is located on a surface of a panel of an electronic equipment enclosure.

In another feature of this aspect, the bezel frame includes a plurality of hooks, each hook including a proximal portion that extends downward from an underside of the elongate body and a distal portion that extends from the proximal portion at an angle downward and away from the frame opening.

In another feature of this aspect, the proximal portions extend downward from locations at the underside of the elongate body that are inset from an outer edge of the elongate body.

In another feature of this aspect, securing the brush port assembly against the brush port opening includes positioning the plurality of hooks against an exposed edge of the brush port opening and rotating the brush port assembly into an installed position.

In another feature of this aspect, the bezel frame includes a plurality of deflectable tabs that extend downward from an underside of the elongate body, each of the deflectable tabs including a wedge at a distal end.

In another feature of this aspect, securing the brush port assembly against the brush port opening includes: positioning the brush port assembly relative to the brush port opening so that the wedges abut an exposed edge of the brush port opening; and applying a force against the brush port assembly sufficient to deflect the deflectable tabs so that the underside of the elongate body is received against the exposed edge of the brush port opening.

In another feature of this aspect, the bezel frame includes a sleeve that extends downward from an inner edge of the elongate body and enters into abutment with an exposed edge of the brush port opening during securement of the brush port assembly against the brush port opening.

Broadly defined, the present invention according to another aspect relates to a method of installing a brush port assembly at a brush port opening of an electronic equipment enclosure. The method includes: providing a brush port assembly including a bezel frame having an elongate body formed as a generally enclosed shape that defines a frame opening and including a plurality of bristles that substantially entirely covers the frame opening, the elongate body including first and second ends arranged in an end-to-end relationship with a gap therebetween, wherein the bezel frame includes a plurality of hooks that extend downward from an underside of the elongate body, and a plurality of deflectable tabs that extend downward from the underside of the elongate body, each of the deflectable tabs including a wedge at a distal end; positioning the brush port assembly relative to the brush port opening so that the hooks engage an exposed edge of the brush port opening; rotating the brush port assembly toward the brush port opening so that the wedges abut the exposed edge of the brush port opening opening; and applying a force against the brush port assembly to deflect the deflectable tabs inward by a distance that is sufficient to clear the opening, upon which the tabs return to an undeflected state, thereby securing the brush port assembly against the exposed edge of the brush port opening.

In a feature of this aspect, a top surface of the elongate body is a smooth surface having rounded edges.

In another feature of this aspect, one or both of the first and second ends of the elongate body are deflectable.

In another feature of this aspect, the generally enclosed shape is generally rectangular.

In another feature of this aspect, the brush port opening is located on a surface of an equipment mounting rail installed in the electronic equipment enclosure.

In another feature of this aspect, the brush port opening is located on a surface of a panel of the electronic equipment enclosure.

In another feature of this aspect, each hook includes a proximal portion that extends downward from the underside of the elongate body and a distal portion that extends from the proximal portion at an angle downward and away from the frame opening. In another feature of this aspect, the proximal portions extend downward from locations at the underside of the elongate body that are inset from an outer edge of the elongate body.

In another feature of this aspect, the bezel frame includes a sleeve that extends downward from an inner edge of the elongate body and enters into abutment with the exposed edge of the brush port opening upon the tabs returning to an undeflected state.

Further areas of applicability of the present invention will become apparent from the detailed description provided hereinafter. It should be understood that the detailed description and specific examples, while indicating preferred embodiment(s) of the invention, are intended for purposes of illustration only and are not intended to limit the scope of the invention.

BRIEF DESCRIPTION OF THE DRAWINGS

Further features, embodiments, and advantages of the present invention will become apparent from the following detailed description with reference to the drawings, wherein.

DETAILED DESCRIPTION

Figure 1:
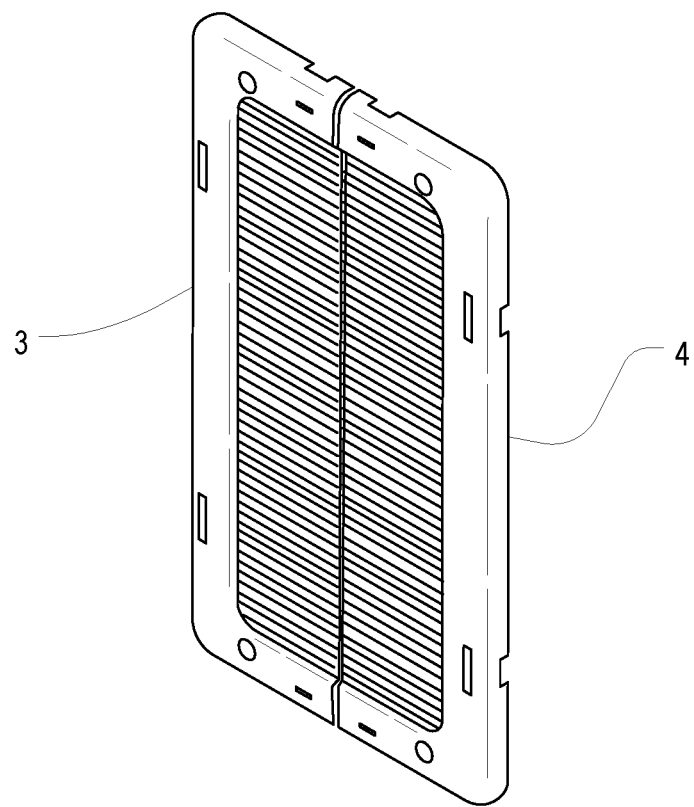
FIG. 1 is an isometric view of a prior art split brush port assembly.
Figure 2:
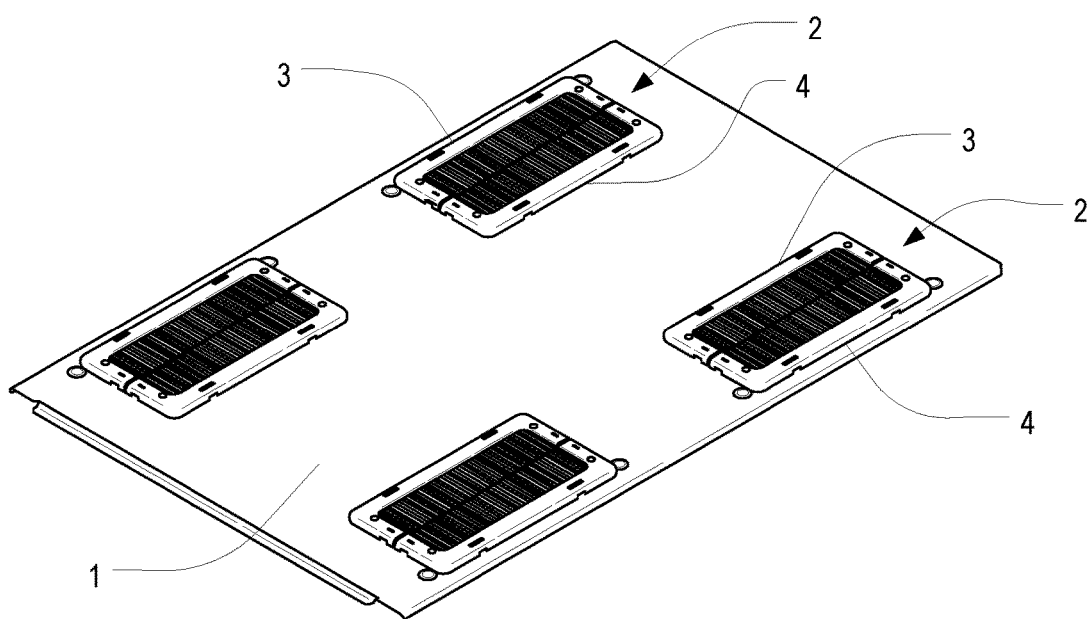
FIG. 2 is an isometric view of four of the prior art assemblies of FIG. 1 shown mounted in a top panel for an electronic equipment enclosure.

As a preliminary matter, it will readily be understood by one having ordinary skill in the relevant art ("Ordinary Artisan") that the present invention has broad utility and application. Furthermore, any embodiment discussed and identified as being "preferred" is considered to be part of a best mode contemplated for carrying out the present invention. Other embodiments also may be discussed for additional illustrative purposes in providing a full and enabling disclosure of the present invention. Furthermore, an embodiment of the invention may incorporate only one or a plurality of the aspects of the invention disclosed herein; only one or a plurality of the features disclosed herein; or combination thereof. Moreover, many embodiments, including adaptations, variations, modifications, and equivalent arrangements, are implicitly disclosed herein and fall within the scope of the present invention.

Accordingly, while the present invention is described herein in detail in relation to one or more embodiments, it is to be understood that this disclosure is illustrative and exemplary of the present invention, and is made merely for the purposes of providing a full and enabling disclosure of the present invention. The detailed disclosure herein of one or more embodiments is not intended, nor is to be construed, to limit the scope of patent protection afforded the present invention in any claim of a patent issuing here from, which scope is to be defined by the claims and the equivalents thereof. It is not intended that the scope of patent protection afforded the present invention be defined by reading into any claim a limitation found herein that does not explicitly appear in the claim itself.

Thus, for example, any sequence(s) and/or temporal order of steps of various processes or methods that are described herein are illustrative and not restrictive. Accordingly, it should be understood that, although steps of various processes or methods may be shown and described as being in a sequence or temporal order, the steps of any such processes or methods are not limited to being carried out in any particular sequence or order, absent an indication otherwise. Indeed, the steps in such processes or methods generally may be carried out in various different sequences and orders while still falling within the scope of the present invention. Accordingly, it is intended that the scope of patent protection afforded the present invention is to be defined by the issued claim(s) rather than the description set forth herein.

Additionally, it is important to note that each term used herein refers to that which the Ordinary Artisan would understand such term to mean based on the contextual use of such term herein. To the extent that the meaning of a term used herein—as understood by the Ordinary Artisan based on the contextual use of such term—differs in any way from any particular dictionary definition of such term, it is intended that the meaning of the term as understood by the Ordinary Artisan should prevail.

With regard solely to construction of any claim with respect to the United States, no claim element is to be interpreted under 35 U.S.C. 112(f) unless the explicit phrase "means for" or "step for" is actually used in such claim element, whereupon this statutory provision is intended to and should apply in the interpretation of such claim element. With regard to any method claim including a condition precedent step, such method requires the condition precedent to be met and the step to be performed at least once during performance of the claimed method.

Furthermore, it is important to note that, as used herein, "a" and "an" each generally denotes "at least one," but does not exclude a plurality unless the contextual use dictates otherwise. Thus, reference to "a picnic basket having an apple" describes "a picnic basket having at least one apple" as well as "a picnic basket having apples." In contrast, reference to "a picnic basket having a single apple" describes "a picnic basket having only one apple."

When used herein to join a list of items, "or" denotes "at least one of the items," but does not exclude a plurality of items of the list. Thus, reference to "a picnic basket having cheese or crackers" describes "a picnic basket having cheese without crackers," "a picnic basket having crackers without cheese," and "a picnic basket having both cheese and crackers." Further, when used herein to join a list of items, "and" denotes "all of the items of the list." Thus, reference to "a picnic basket having cheese and crackers" describes "a picnic basket having cheese, wherein the picnic basket further has crackers," as well as describes "a picnic basket having crackers, wherein the picnic basket further has cheese."

Referring now to the drawings, in which like numerals represent like components throughout the several views, one or more preferred embodiments of the present invention are next described. The following description of one or more preferred embodiment(s) is merely exemplary in nature and is in no way intended to limit the invention, its application, or uses.

Figure 5:
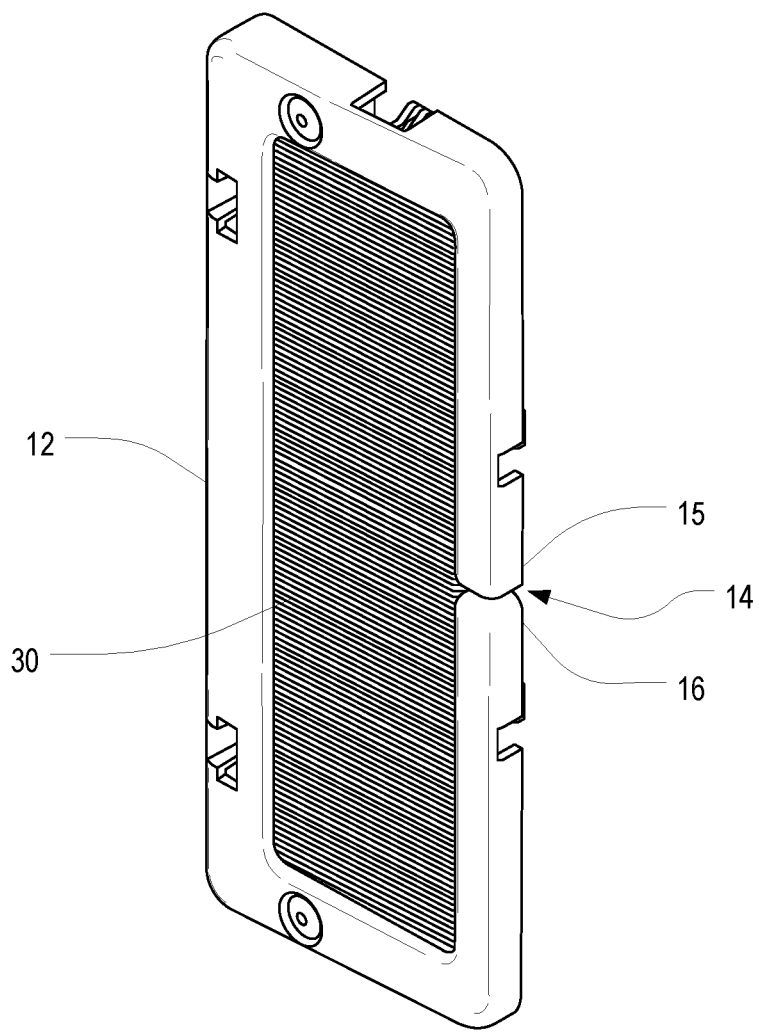
FIG. 5 is a front isometric view of a brush port assembly having a one-piece split frame or bezel in accordance with one or more preferred embodiments of the present invention.
Figure 6:
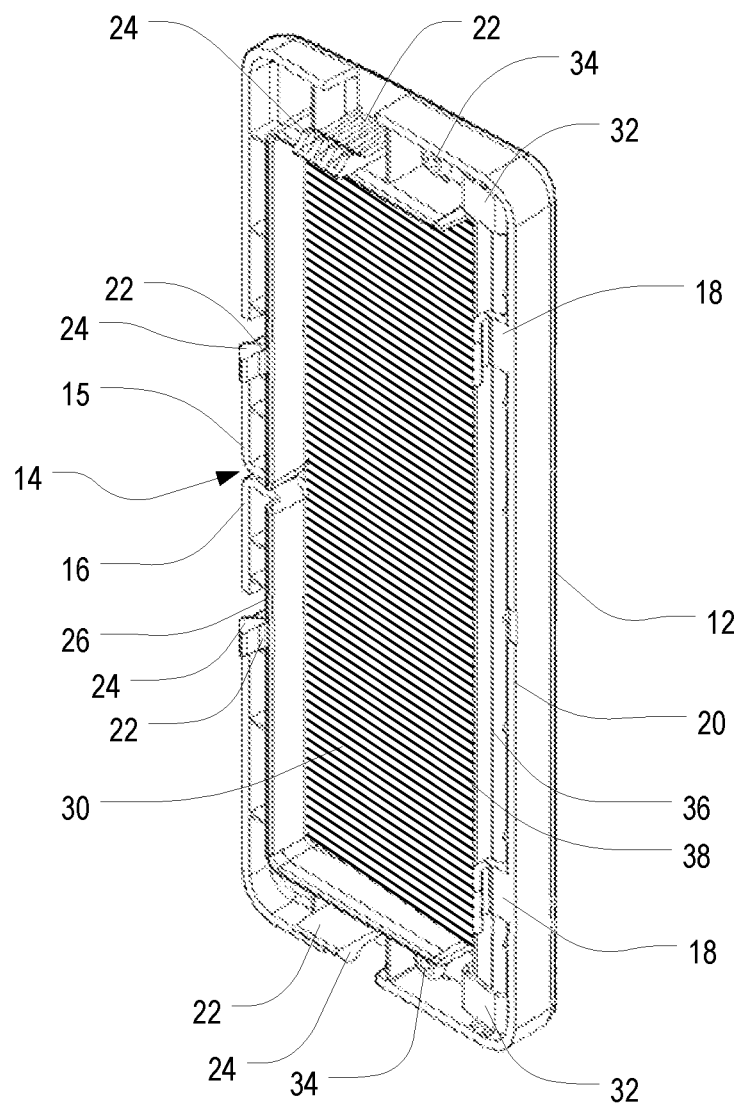
FIG. 6 is a rear isometric view of the brush port assembly of FIG. 5.

FIG. 5 is a front isometric view of a brush port assembly 10 having a one-piece split frame or bezel 12 in accordance with one or more preferred embodiments of the present invention, and FIG. 6 is a rear isometric view of the brush port assembly 10 of FIG. 5. As shown in FIGS. 5 and 6, the brush port assembly 10 includes a bezel 12 having a one-piece construction. The bezel 12 is shaped and sized to fittingly correspond with an opening in an equipment accessory, panel, or other structure so that the bezel 12 provides a perimeter around the opening. As perhaps best shown in FIG. 5, the bezel 12 preferably includes rounded exposed edges so that cables or wiring that pass through the opening are not exposed to sharp-edged surfaces.

As further shown in FIGS. 5 and 6, the bezel 12 of the brush port assembly 10 specifically does not form an enclosed, closed-loop, ring structure. Rather, the bezel 12 includes a split or gap 14 at one side thereof where exposed ends 15, 16 of the bezel 12 are positioned adjacent, and aligned with, one another. In this manner, the brush port assembly 10 is constructed to be capable of installation at an opening where cables are already present, as will be explained in greater detail below. In at least some contemplated embodiments, the bezel 12 is generally rectangular-shaped to fittingly correspond with a generally rectangular-shaped opening in an equipment accessory, panel, or the like. However, other shapes, sizes, and configurations are likewise contemplated such that a bezel of this type is adaptable to fit a wide range of opening types and sizes. The bezel 12 retains a brush component 30 that covers some or all of an opening 28 (seen in FIG. 7) defined through the bezel 12 by interior surfaces thereof With reference to FIG. 6, the bezel 12 includes a variety of features that may facilitate attachment of the bezel 12 to the edge or edges of an opening in a panel or other structure of an equipment enclosure. The bezel 12 includes a pair of spaced-apart hooks 18 along one side thereof. Although such hooks 18 are depicted in FIG. 6 as being located along a side opposite that of the gap 14, it is contemplated that the pair of hooks 18 can be located along the same side of the bezel 12 as the gap 14. A proximal end of each hook 18 is inset from an outer edge 20 of the bezel 12. Each hook 18 includes a first portion that extends downward from an underside of the bezel and a second portion that extends in an angled direction that is downward and away from the first portion. In this regard, each hook 18 is shaped to hook around an edge of another structure to initiate installation of the brush port assembly 10.

With further reference to FIG. 6, the bezel 12 also includes a plurality of deflectable tabs 22, each of which extends downward from an underside of the bezel 12 beyond the plane defined by the outer edges 20 of the bezel 12. Each tab 22 includes a wedge 24, having a generally triangular cross-section, at a distal end thereof and which, when pressed against another structure, will cause the tab 22 to be deflected inward. In some contemplated embodiments, such as in FIG. 6, there are four tabs 22—one disposed along each of the two shorter sides of the generally rectangular-shaped bezel 12 and two along the same side of the bezel 12 as the gap 14 (i.e., at the side opposite of the hooks 18). However, other quantities and arrangements of tabs 22 are likewise contemplated. Furthermore, the size and shape of each tab 22, including its wedge 24, may vary both from that which is disclosed herein and from each other.

As shown in FIG. 6, portions of the bezel 12 preferably also include an inner sleeve 26 that is inset a small distance from the outer edge 20 of the respective portion. In at least some embodiments, it is contemplated that this distance corresponds to the lateral thickness of the side of the bezel 12 along which the sleeve 26 is arranged. The inner sleeve 26 defines, at least in part, the opening 28 that is covered by the brush component 30. In the illustrated embodiment, the inner sleeve 26 includes a respective section on either side of the gap 14 and a respective section along each of the short sides of the bezel 12. In some contemplated embodiments, the inner sleeve 26 extends beyond (i.e., lower than) the plane defined by the outer edges 20 of the bezel 12 as illustrated, for example, in FIG. 11A.

Figure 7:
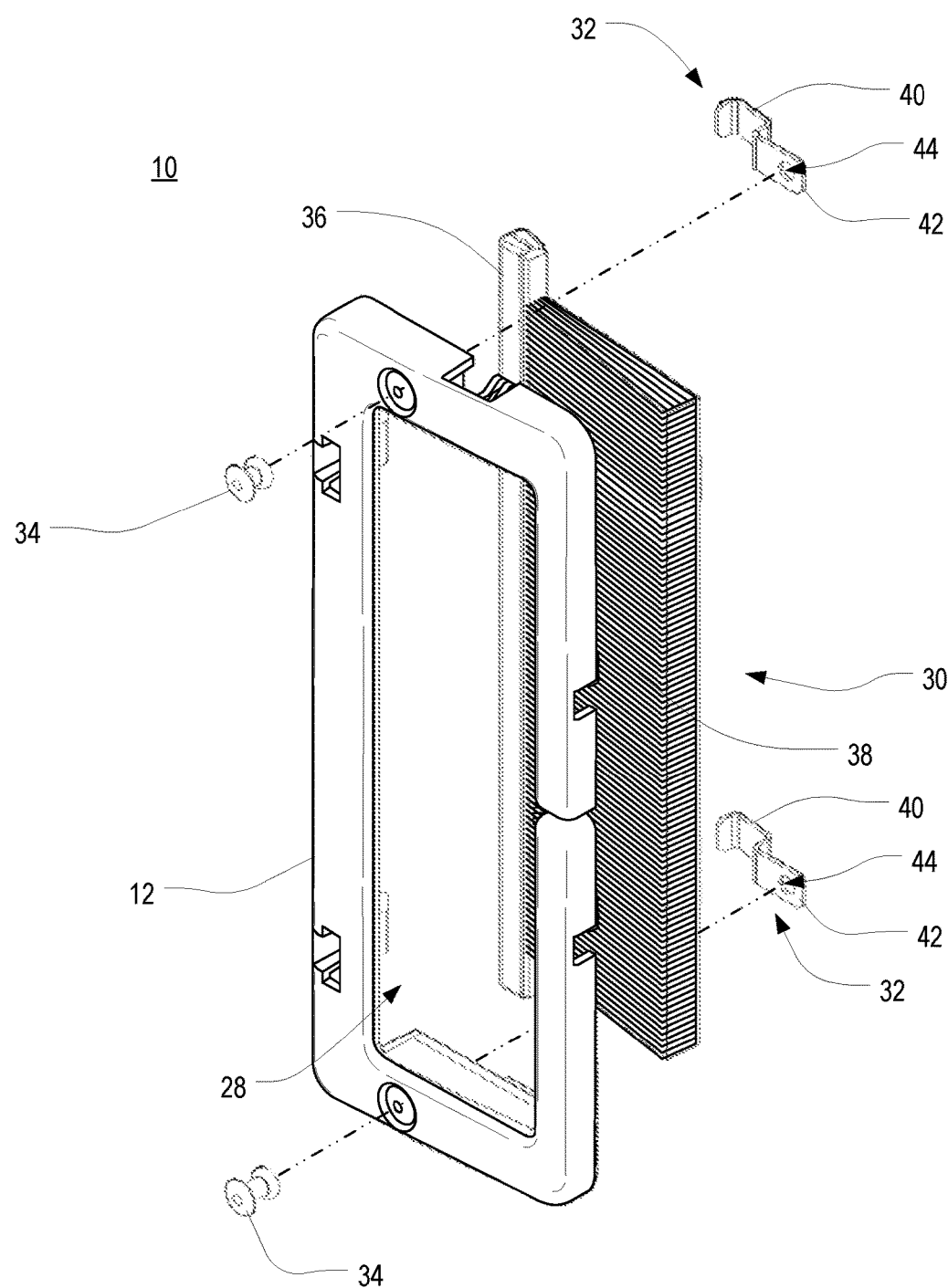
FIG. 7 is an exploded isometric view of the brush port assembly of FIG. 5.

FIG. 7 is an exploded isometric view of the brush port assembly 10 of FIG. 5. As shown in FIG. 7, the brush port assembly 10 further includes a brush component 30 seated at an underside of the bezel 12 and a pair of brush clamps 32. The brush component 30 includes a spine member 36 from which a plurality of brush bristles 38 extend. As shown in FIG. 7, brush bristles 38 extend from the spine member 36 in the same direction. As perhaps best shown in FIG. 6, the brush clamps 32 hold the spine member 36 in place on the underside of the bezel 12 and are anchored to the bezel 12 with a respective fastener 34.

In at least some embodiments, each brush clamp 32 is formed from a bent piece of sheet metal to form a cradle 40 that supports the spine member 36 of the brush component 30. A tab 42 formed at one end of the cradle 40 includes an aperture 44 for receipt of the fastener 34. In at least some embodiments, the fasteners are permanent mechanical fasteners such as rivets, although various forms of removable mechanical fasteners are likewise contemplated. In other contemplated embodiments, each brush clamp 32 is a plastic clip, and the fastener 34 is a screw that secures the brush clamp 32 against the underside of the bezel 12. In still other contemplated embodiments, the bezel 12 may itself include snap-in features or other retention geometry at the underside thereof for receiving and securing the brush clamp 32.

Figure 8:
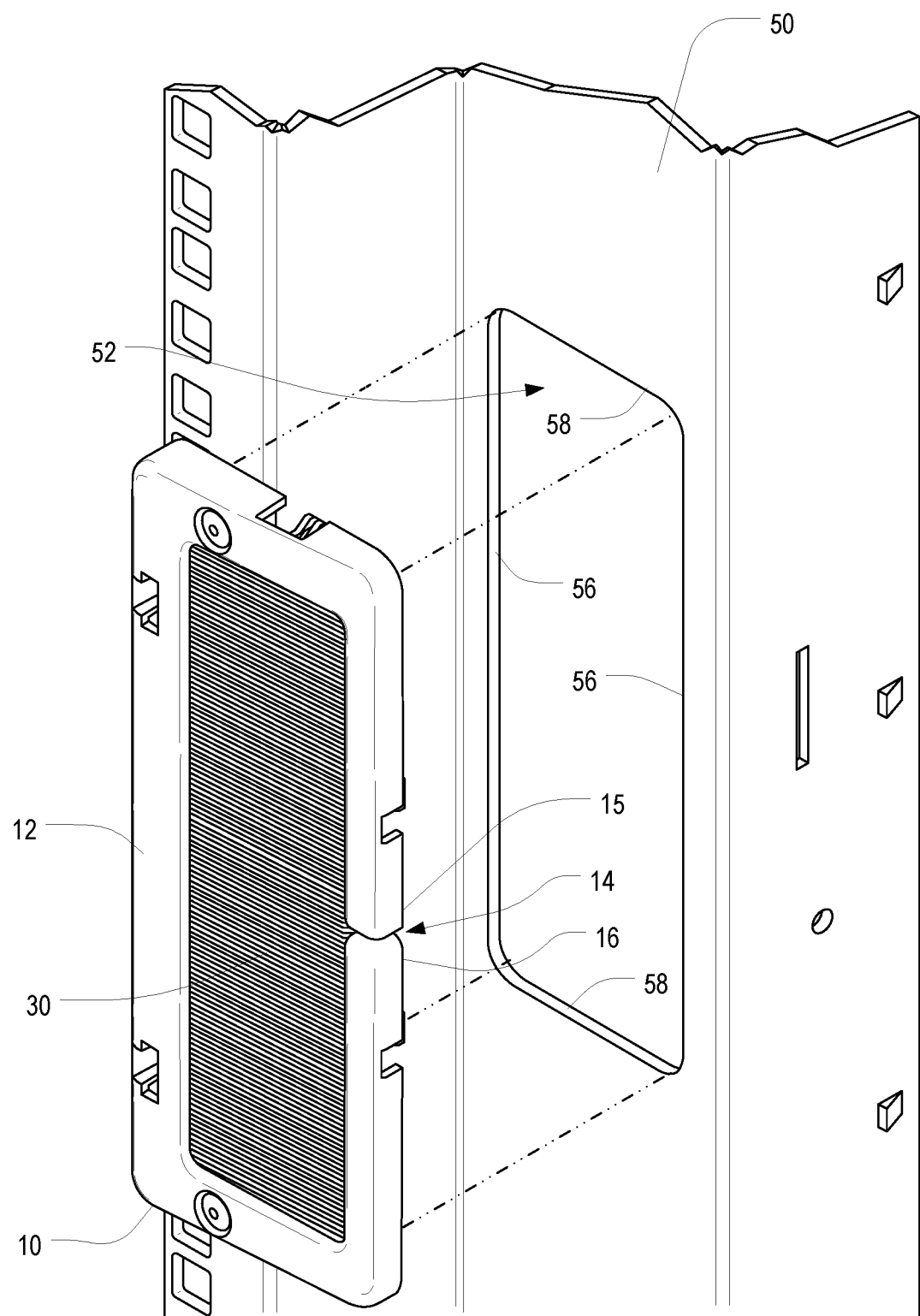
FIG. 8 is a fragmentary isometric view of the brush port assembly of FIG. 5 being installed in an opening in an equipment rail of an electronic equipment enclosure.
Figure 9:
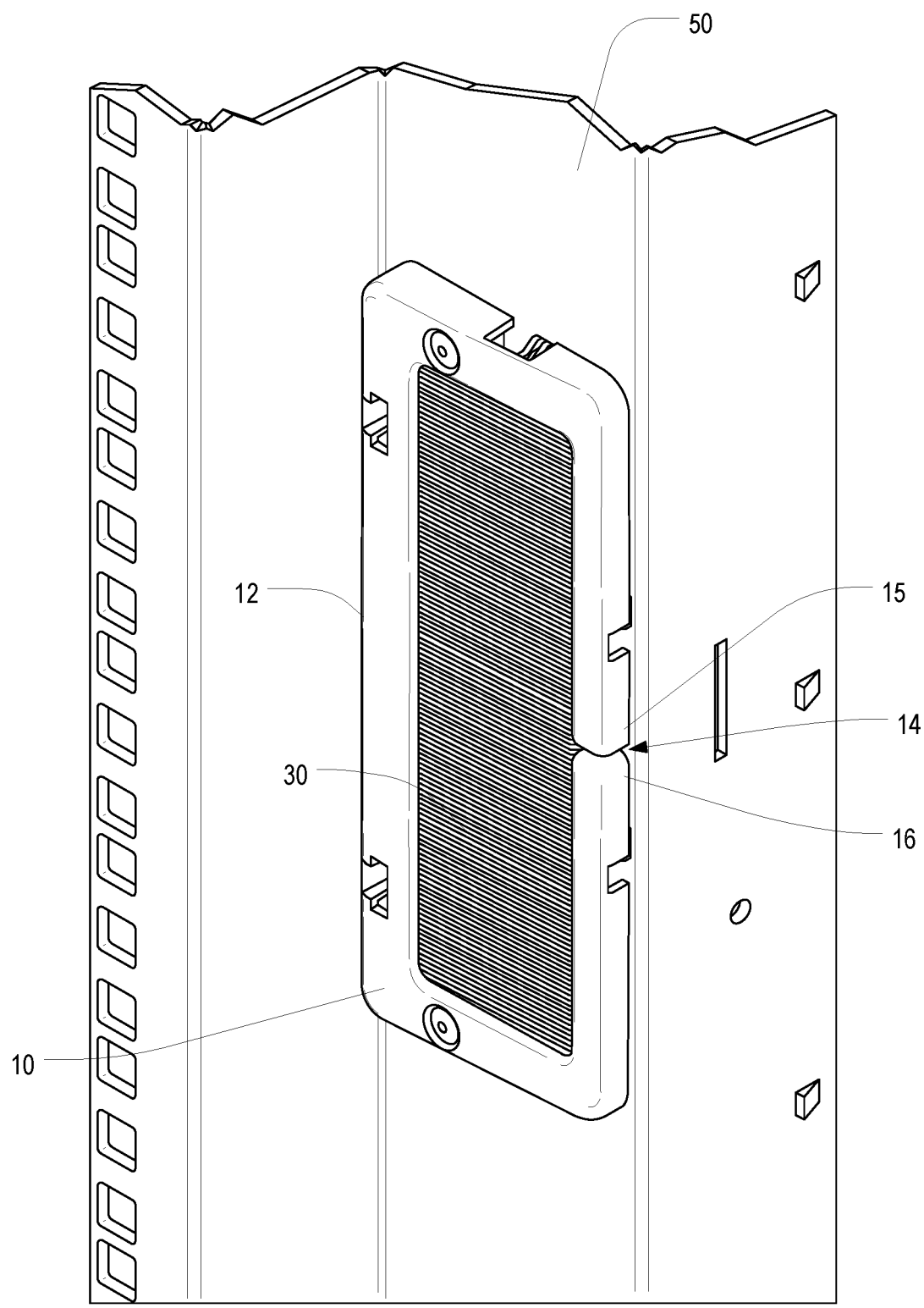
FIG. 9 is a fragmentary isometric view of the brush port assembly fully installed in the opening in the equipment rail.

FIG. 8 is a fragmentary isometric view of the brush port assembly 10 of FIG. 5 being installed in an opening 52 in an equipment rail or other structure 50 of an electronic equipment enclosure. However, in contemplated embodiments, a brush port assembly 10 in accordance with one or more aspects of the present invention is installable in an opening of a variety of different structures in an electronic equipment enclosure, including rails, panels, and accessories installed therein. FIG. 9 is a fragmentary isometric view of the brush port assembly 10 fully installed in the opening in the equipment rail 50, and FIG. 10 is a rear fragmentary isometric view of the brush port assembly 10 and equipment rail 50.

Figure 11:
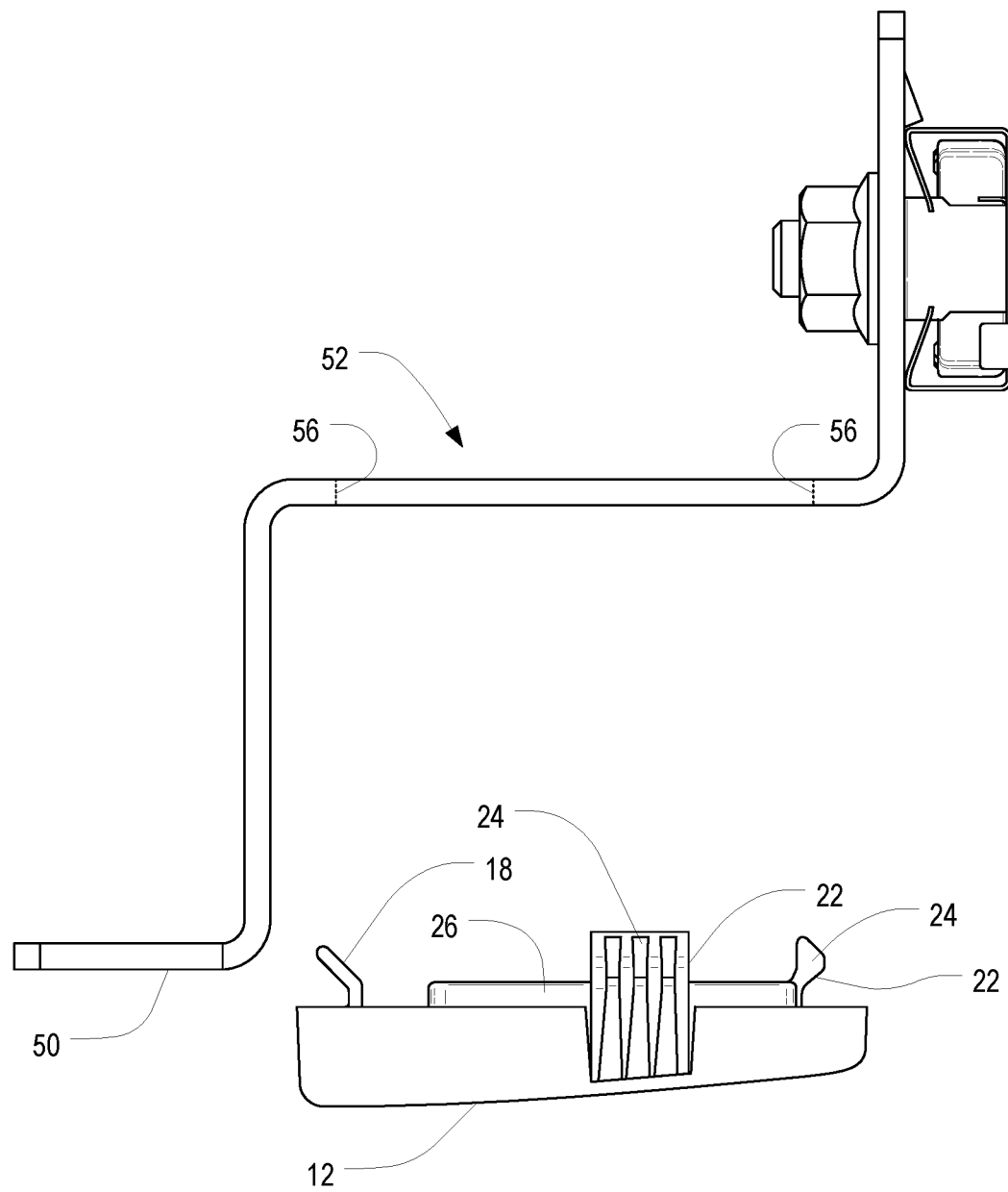
FIG. 11 is a top view of the brush port assembly and equipment rail of FIG. 8.
Figure 12:
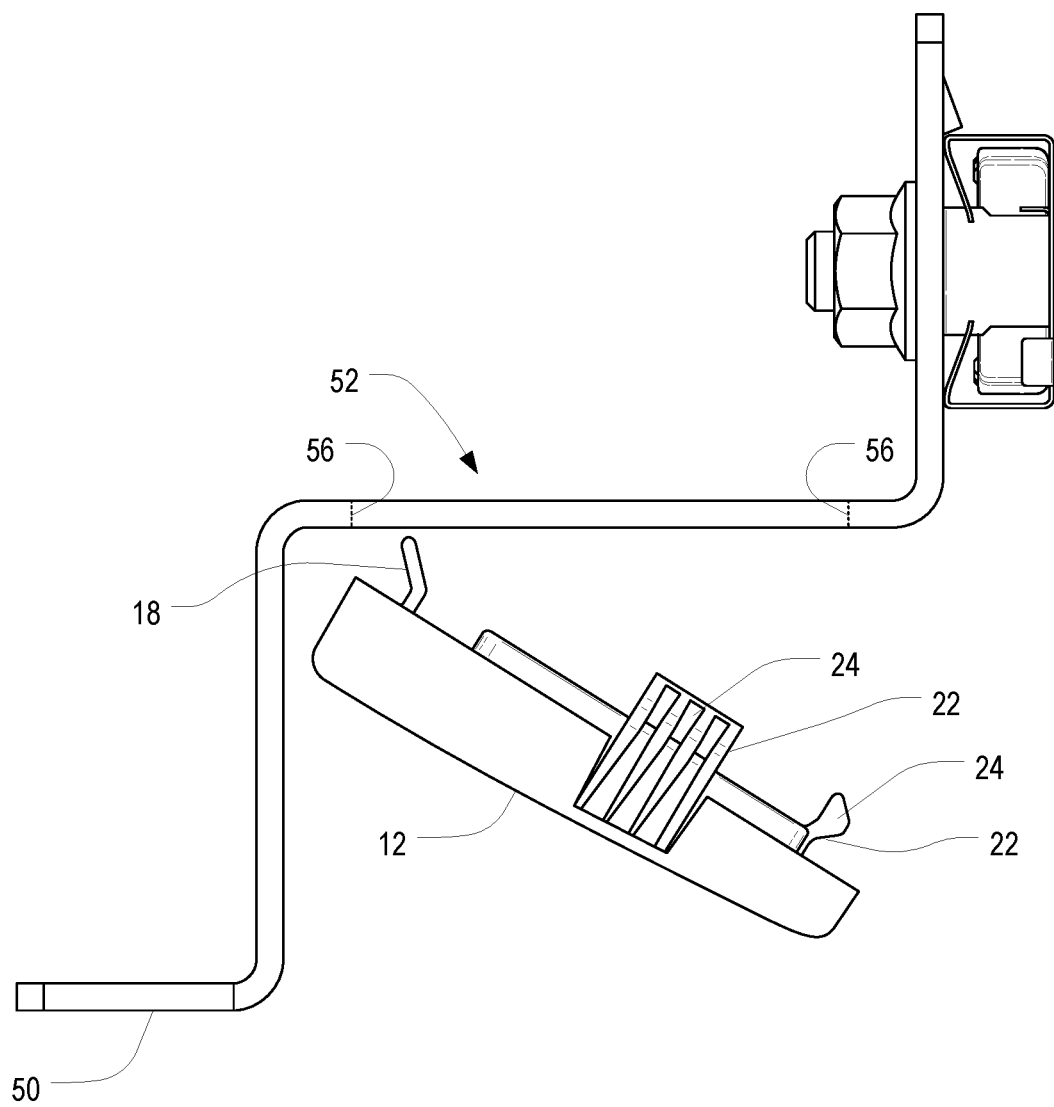
FIGS. 12 and 13 are top views of the brush port assembly and equipment rail of FIG. 11, shown with the brush port assembly being angled into position.
Figure 13:
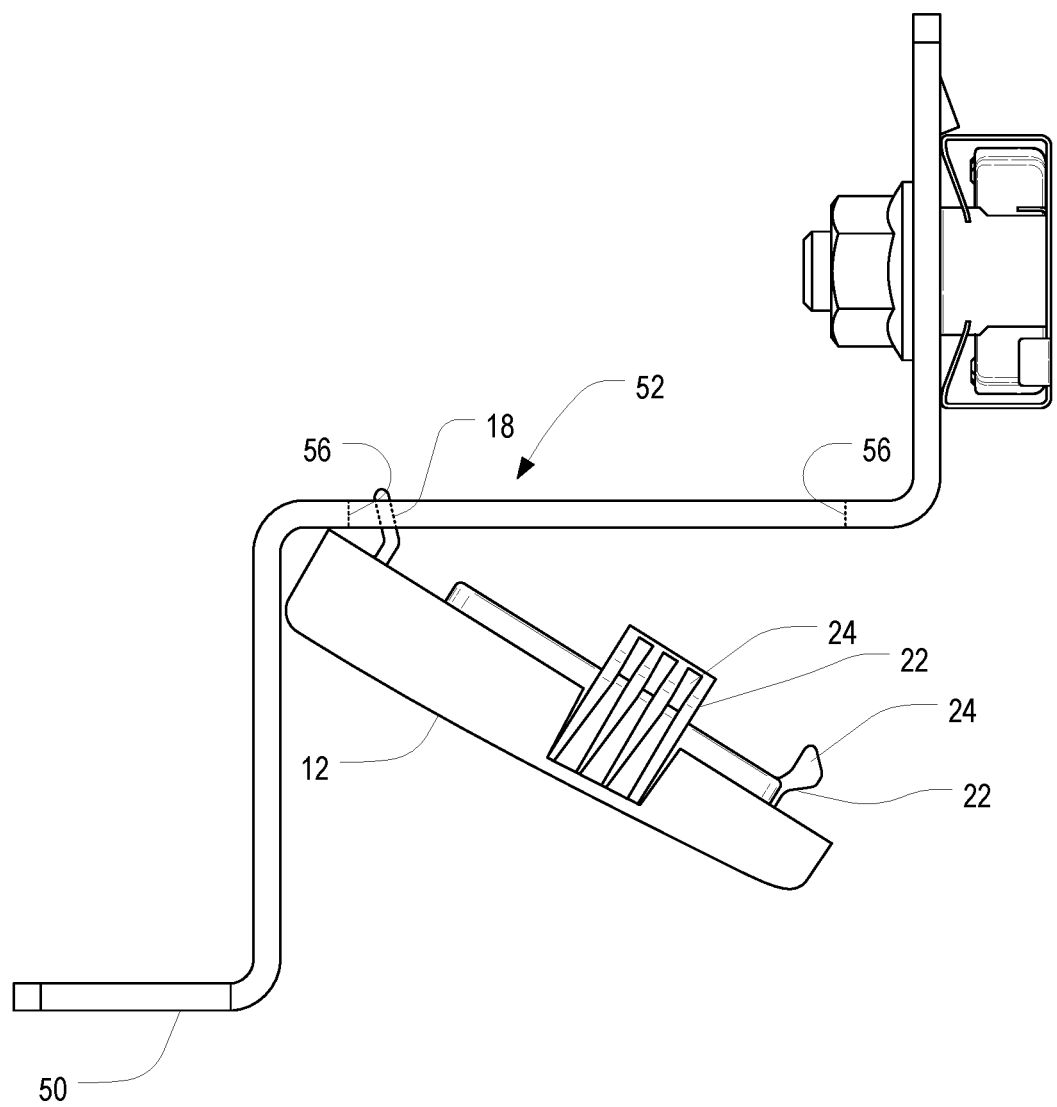
Figure 14:
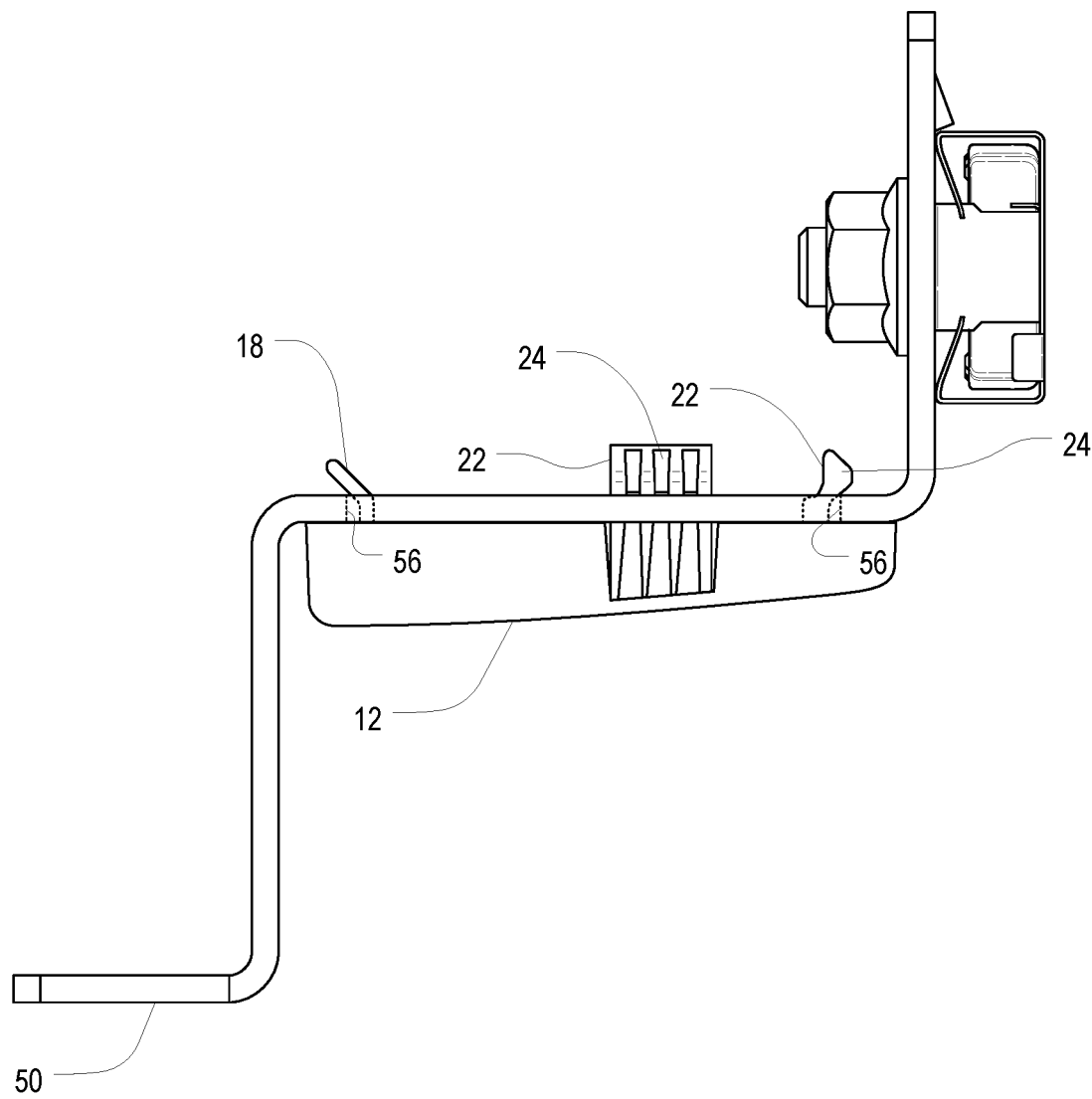
FIG. 14 is a top view of the brush port assembly and equipment rail of FIG. 9.

In at least some embodiments, the brush port assembly 10 is installable in an opening 52 in an electronic equipment enclosure structure 50 without the aid of tools. FIGS. 11-14 depict a contemplated method of installation of the brush port assembly 10 in an opening 52 (shown schematically) in an equipment rail 50 of an electronic equipment enclosure. More particularly, FIG. 11 is a top view of the brush port assembly 10 and equipment rail 50 of FIG. 8, and FIGS. 12 and 13 are top views of the brush port assembly 10 and equipment rail 50 of FIG. 11, shown with the brush port assembly 10 being angled into position. As shown in FIGS. 12 and 13, the brush port assembly 10 may be positioned adjacent an opening 52 of the equipment enclosure so that the hooks 18 along one side of the bezel 12 are engaged against an edge 56 on one side of the opening 52. The outwardly angled distal ends of the hooks 18 retain the bezel 12 in position against the side edge 56 of the opening 52 as the bezel 12 is rotated toward the opening 52. As the bezel 12 is rotated toward the opening 52, the triangular wedges 24 at the distal ends of each tab 22 engage upper and lower edges 58 of the opening 52 (shown, for example, in FIG. 8). More particularly, the wedges 24 of the tabs 22 of the top and bottom ends of the bezel 12 engage upper and lower edges 58, while the wedges 24 of the tabs 22 along the side of the bezel 12 engage a side edge 56. Application of a force against the bezel 12 maneuvers the wedges 24 along the edges 56, 58 of the opening 52, thereby causing the tabs 22 to be deflected inward. Once the wedges 24 have fully cleared the edges 56,58 of the opening 52, the tabs 22 snap back to an undeflected state, and the brush port assembly 10 is installed on the electronic equipment enclosure structure 50. FIG. 14 is a top view of the brush port assembly 10 and equipment rail 50 of FIG. 9, which shows the brush port assembly 10 fully installed in the opening 52. As shown in FIG. 14, it is contemplated that the outer edge 20 of the bezel 12 is seated flush against the surface of the electronic equipment enclosure structure 50 when the brush port assembly 10 is installed.

With reference again to FIG. 10, at least a distal end of the inner sleeve 26 of the bezel 12 is received within the opening 52 when the brush port assembly is installed on the electronic equipment enclosure structure 50. The inner sleeve 26 forms a perimeter against the edge of the opening 52 to prevent cables or wiring from entering into contact with sheet metal or other materials of the enclosure structure 50, which are often sharp or otherwise abrasive to such cables. Also, in the installed position, bristles 38 of the brush component 30 are arranged to extend across the opening 52 to provide an airflow barrier. In this regard, the brush component 30 reduces or prevents airflow through the opening 52, even when cables have been arranged to pass through the opening 52.

Figure 10:
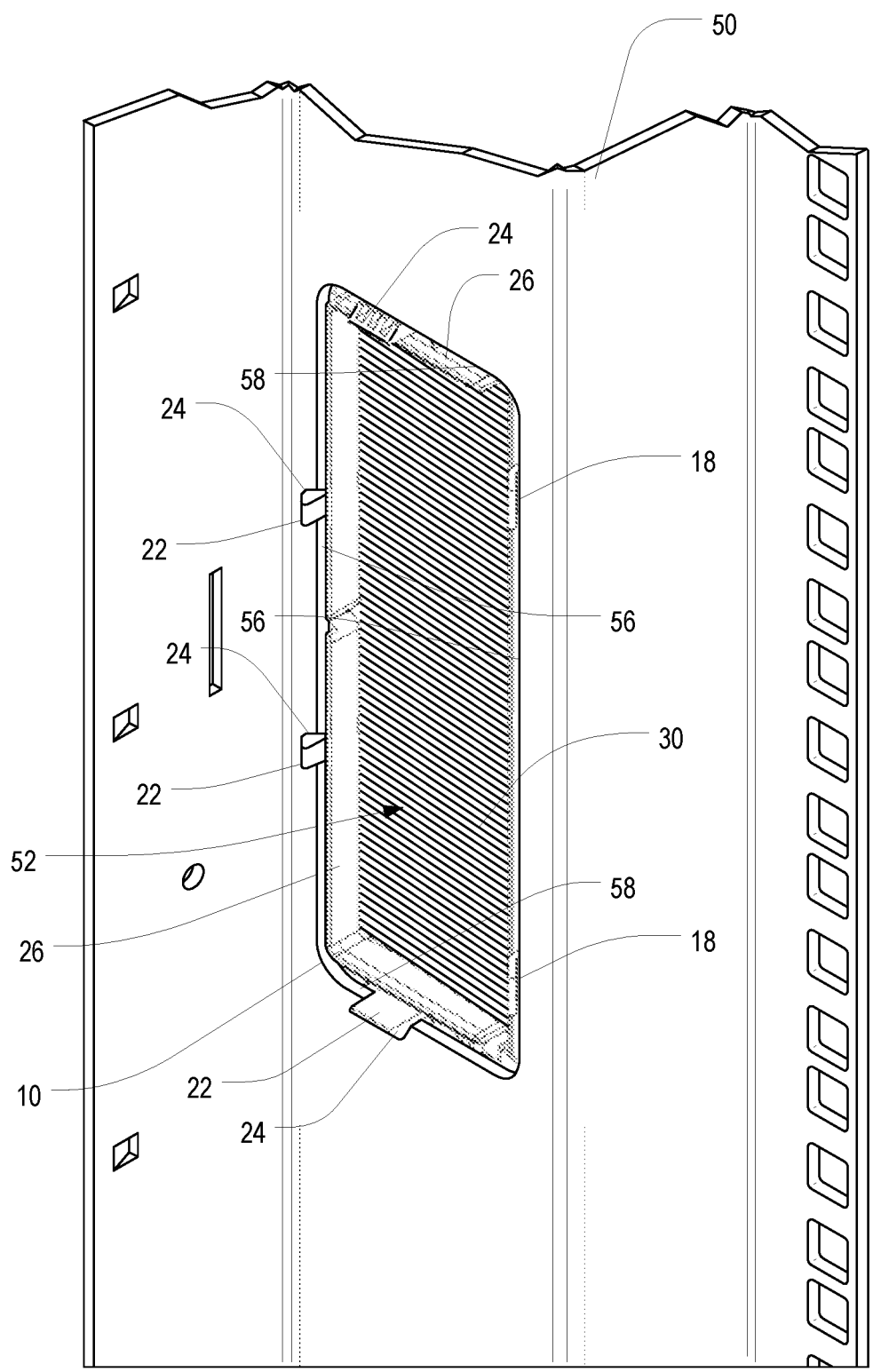
FIG. 10 is a rear fragmentary isometric view of the brush port assembly and equipment rail.

With particular reference to FIGS. 10 and 14, the tabs 22 and hooks 18 are configured to facilitate installation of the brush port assembly 10 to surfaces having a wide range of different thicknesses. In this regard, it is contemplated that the outwardly-extending angled portions of the hooks 18 are positionable against interior edges of very thin structures, such as a panel or other sheet metal structure. It is likewise contemplated that the outwardly-extending angled portions of the hooks 18 extend sufficiently far from the bezel 12 to facilitate positioning of the hook 18 against interior edges of much thicker structures, such as rails or accessories. Furthermore, it is contemplated that wedges 24 at distal ends of the tabs 22 are located sufficiently beyond the plane defined by the outer edges 20 of the bezel 12 as to permit snap-fitting of the bezel 12 to thin structures as well as much thicker structures.

Figure 15:
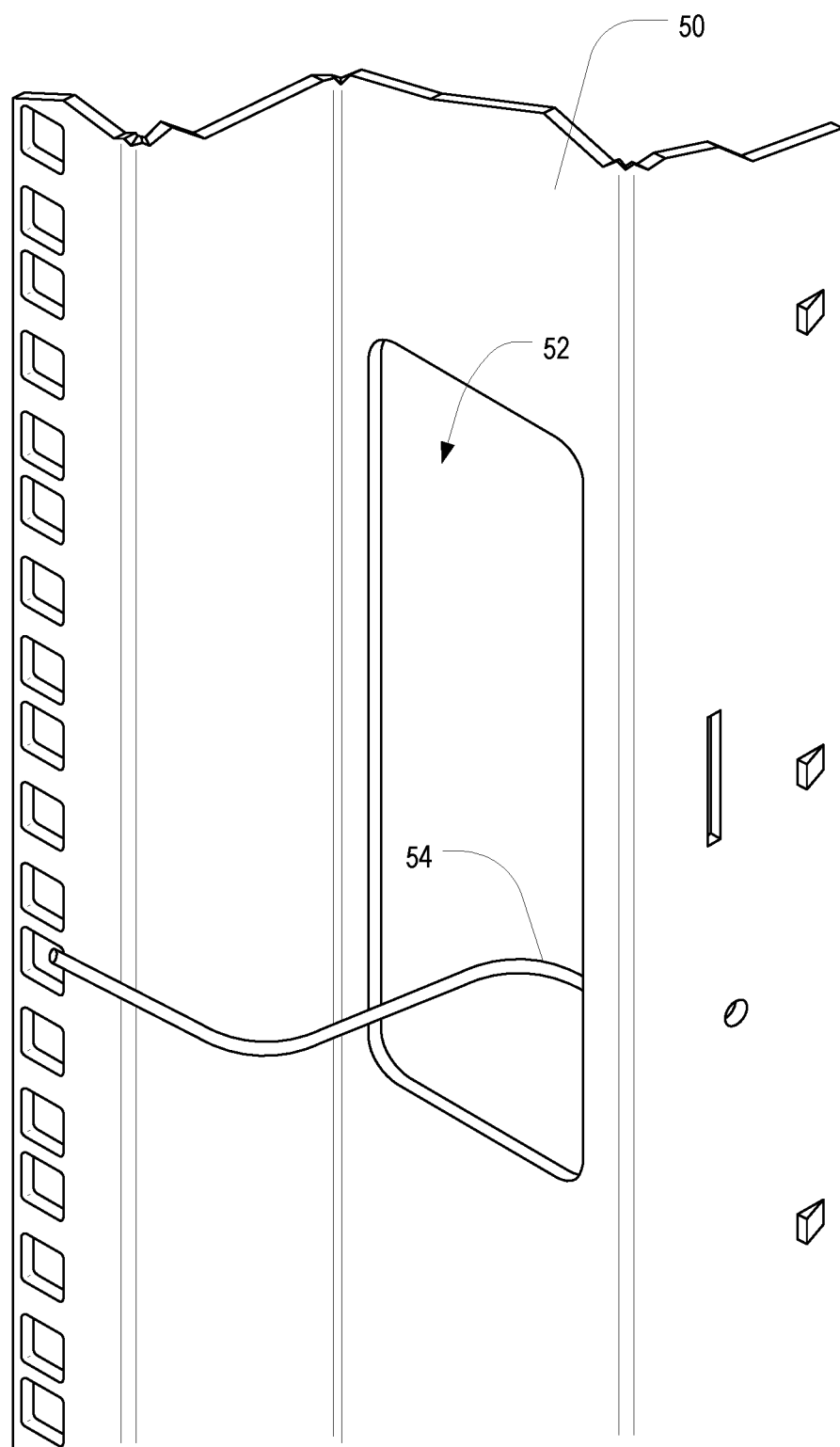
FIG. 15 is a fragmentary isometric view of the equipment rail of FIG. 8, shown with a previously-installed cable extending through the opening therein.

FIG. 15 is a fragmentary isometric view of the equipment rail 50 of FIG. 8, shown with a previously-installed cable 54 extending through the opening 52 therein. A brush port assembly 10 in accordance with one or more aspects of the present invention is installable at an opening 52 in an electronic equipment enclosure structure 50 that already includes a cable or wiring 54 passing therethrough. In this regard, reference is made to FIG. 16, which is a fragmentary isometric view of the brush port assembly 10 of FIG. 5 being manipulated around the previously-installed cable 54, and to FIG. 17, which is a fragmentary isometric view of the brush port assembly 10 fully installed around the cable 54 in the opening 52 in the electronic equipment enclosure structure 50.

Figure 16:
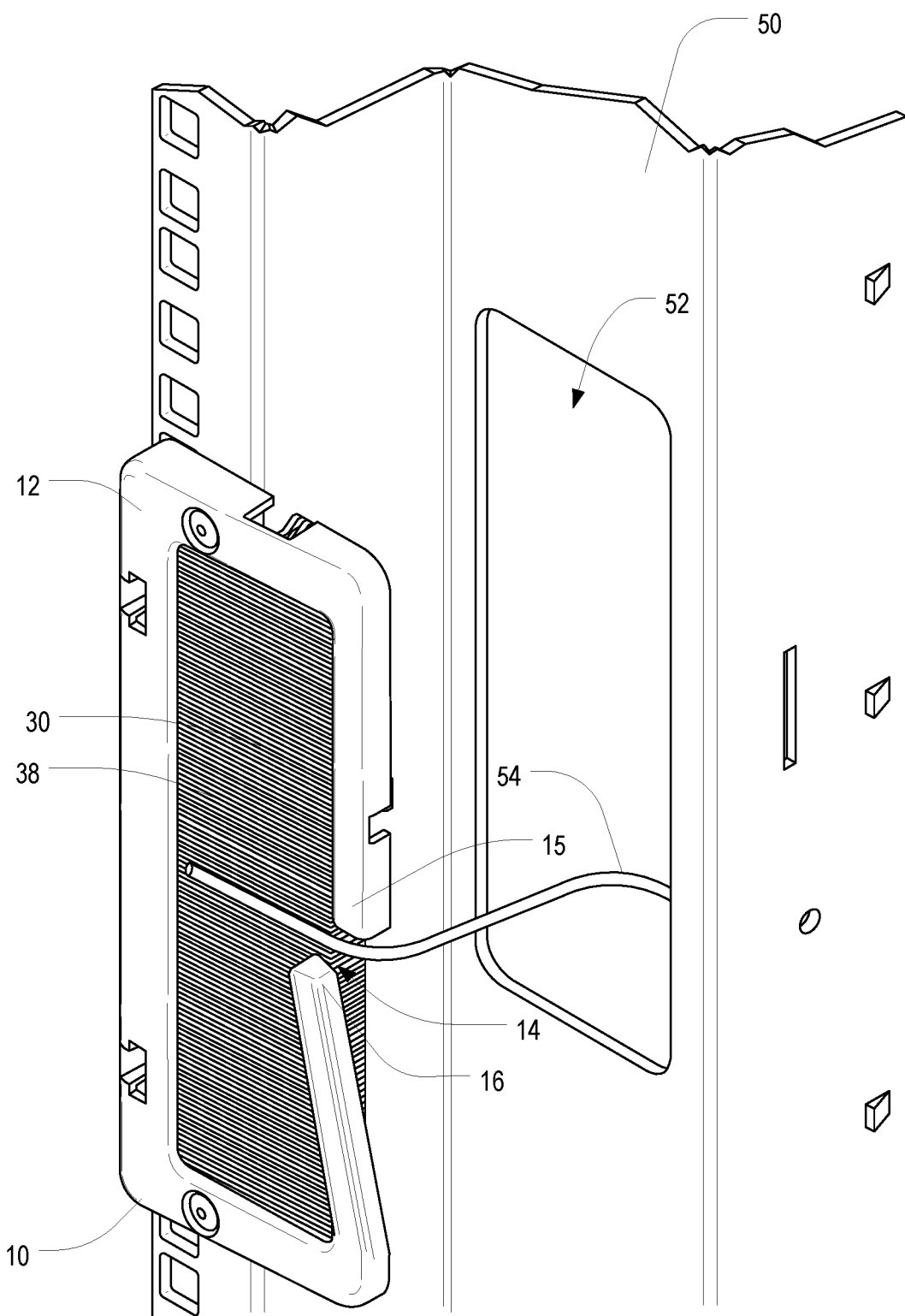
FIG. 16 is a fragmentary isometric view of the brush port assembly of FIG. 5 being manipulated around the previously-installed cable.
Figure 17:
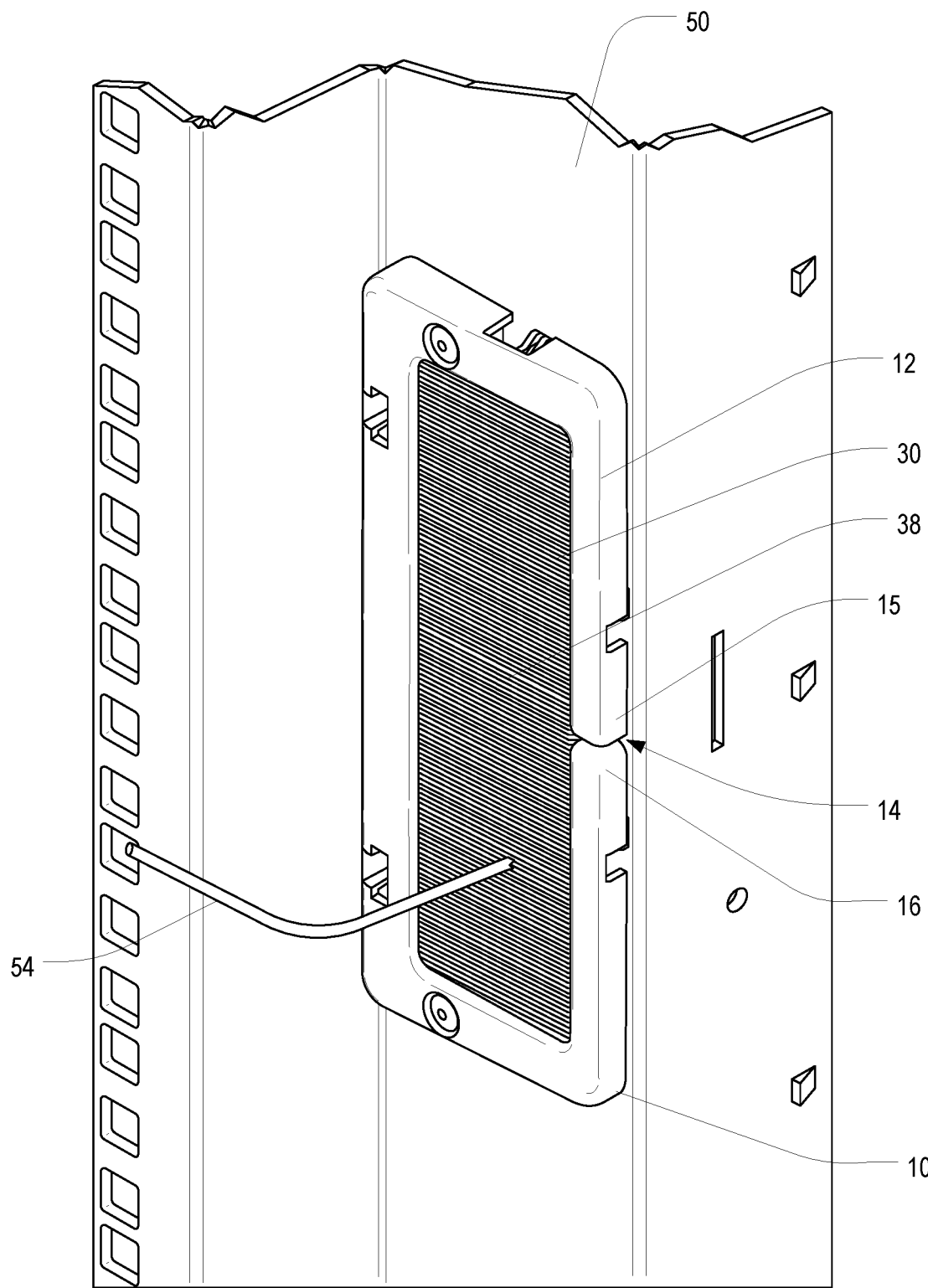
FIG. 17 is a fragmentary isometric view of the brush port assembly fully installed around the cable in the opening in the equipment rail.

With reference to FIGS. 16 and 17, a previously-installed cable 54 is maneuverable through the gap 14 in the bezel 12. In some contemplated embodiments, the gap 14 is sufficient to accommodate the cable 54 being positioned therethrough and positioned among the bristles 38 of the brush component 30, all without bending or deforming the bezel 12. In other contemplated embodiments, the gap 14 is too small to accommodate the cable. In such instances, it is contemplated that one or both of the exposed ends 15, 16 of the bezel 12 are bendable or deflectable to facilitate the previously-installed cable 54 being positioned through the gap 14 and positioned among the bristles 38 of the brush component 30. Once a previously-installed cable has been maneuvered through the gap 14, the brush port assembly 10 is installable in an opening of an electronic equipment enclosure, such as in the manner described above in connection with FIGS. 11-14.

It is contemplated that a brush port assembly 10 in accordance with one or more aspects of the present invention is a self-contained unit that helps to reduce air flow and to provide edge protection for wiring and cables arranged through ports in an electronic equipment enclosure. As described herein, the brush port assembly 10 can be installed, without the aid of tools, to a range of mounting surface thicknesses, and the assembly can accommodate existing wiring passing through ports. It is contemplated that the brush port assembly 10 is mountable from one side of an opening on accessible surfaces. Additionally, it is further contemplated that the brush port assembly 10 is removable and replaceable with other pass-through devices or products, such as a rubber grommet, or may itself replace other pass-through devices or products. Still further, it is contemplated that the brush port assembly 10 does not require the mounting surface around the opening to have any additional features (holes, notches, etc.) to facilitate installation in the mounting surface, other than the port opening itself.

Figure 3:
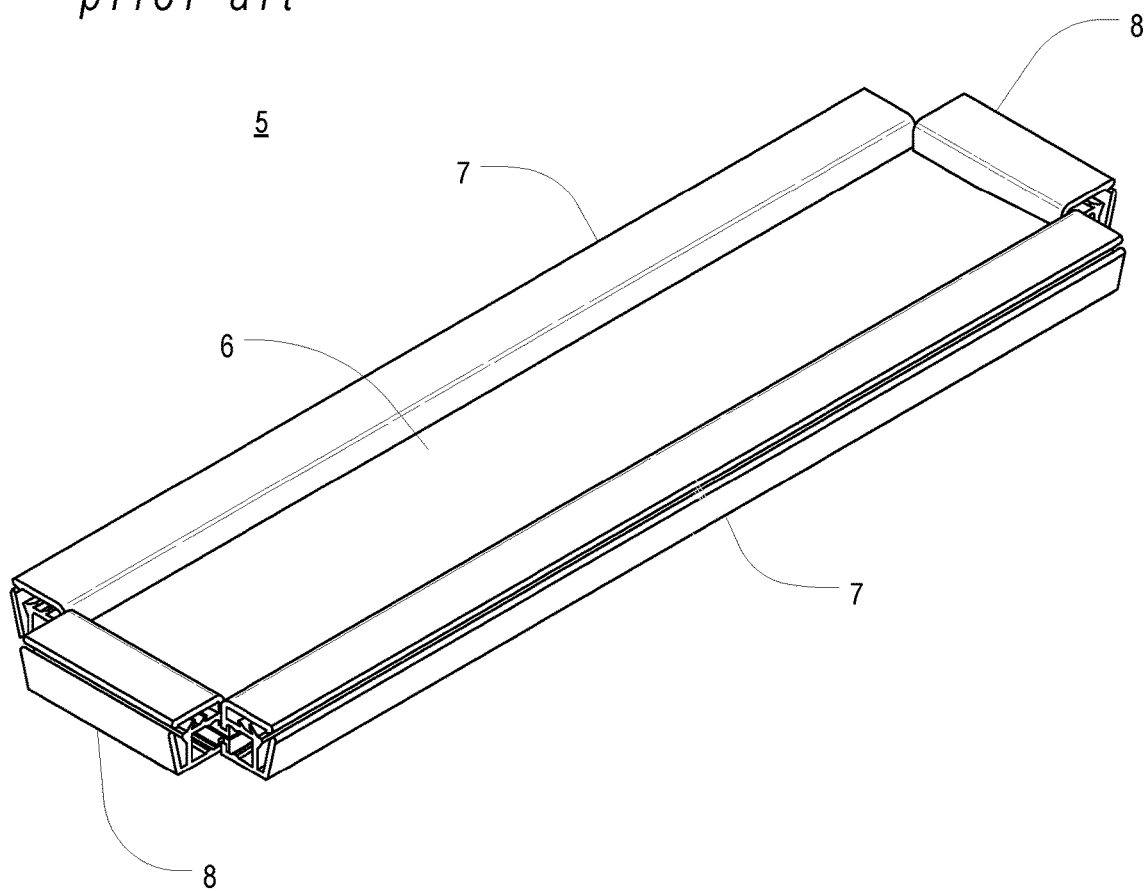
FIG. 3 is an isometric view of a prior art multi-piece brush port assembly.
Figure 4:
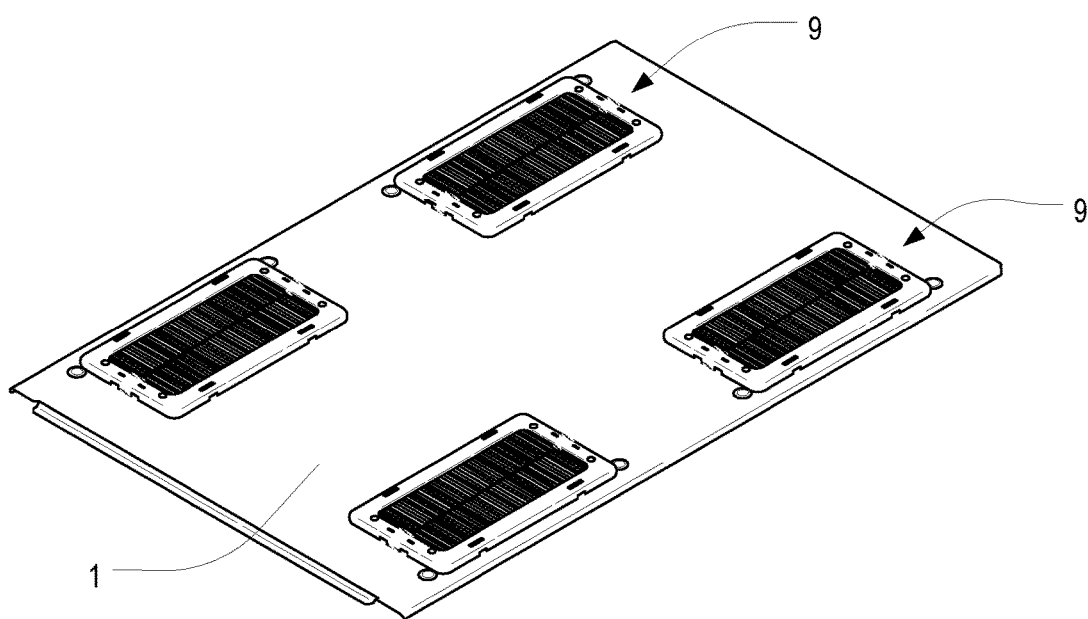
FIG. 4 is an isometric view of four other prior art brush port assemblies mounted in a top panel for an electronic equipment enclosure.
Figure 18:
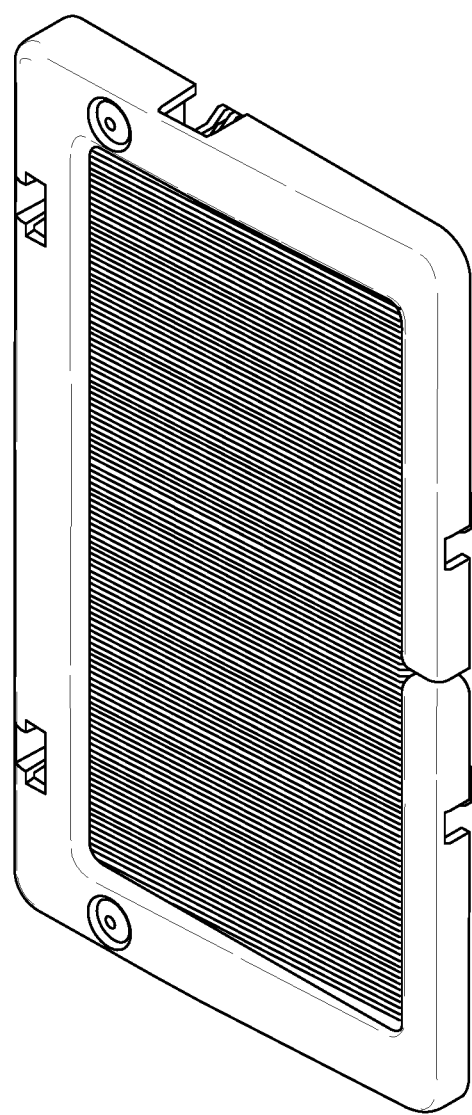
FIG. 18 is a front isometric view of a larger brush port assembly having a one-piece split frame or bezel in accordance with one or more preferred embodiments of the present invention.
Figure 19:
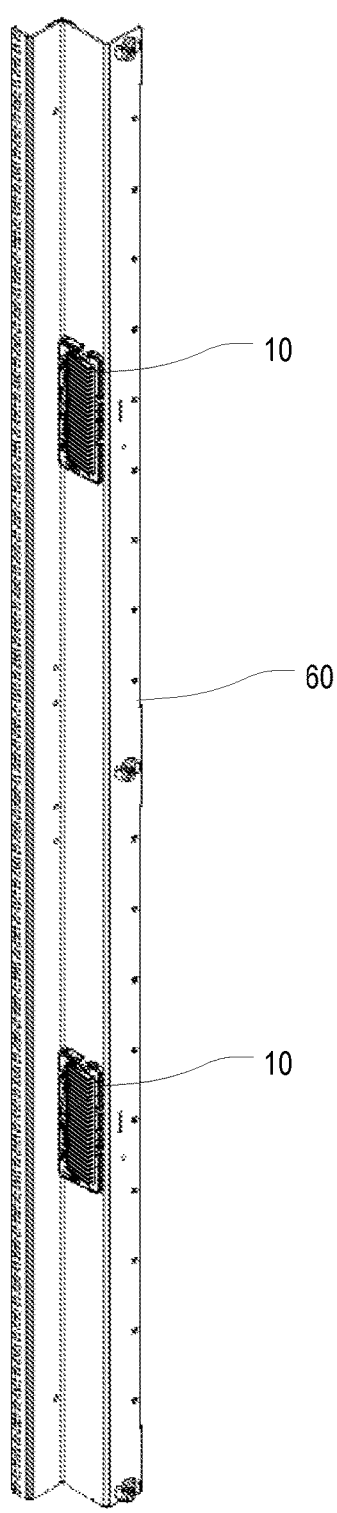
FIG. 19 is an isometric view of two of the brush port assemblies of FIG. 5 installed in a vertical mounting rail.
Figure 20:
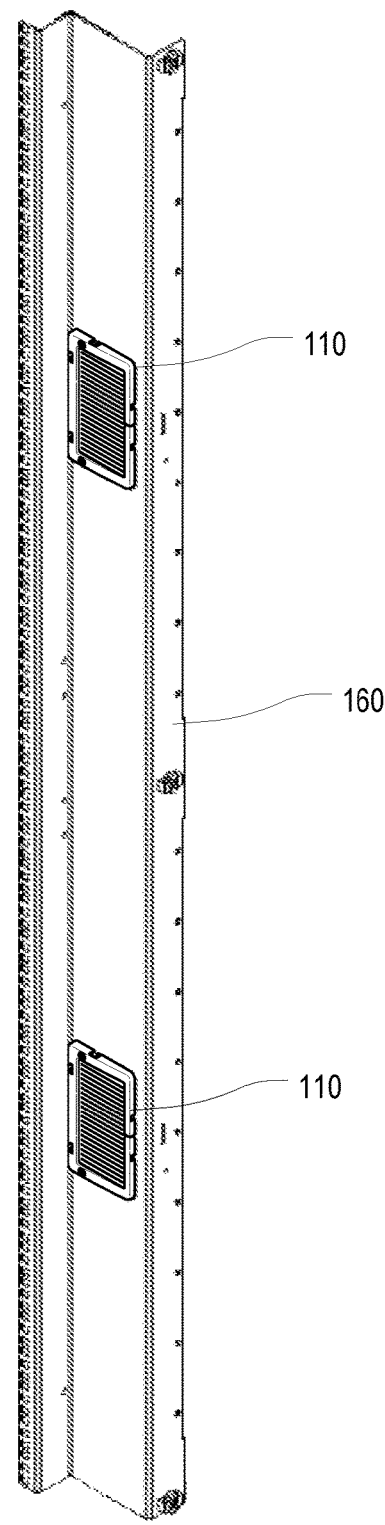
FIG. 20 is an isometric view of two larger brush port assemblies installed in a vertical mounting rail in accordance with one or more preferred embodiments of the present invention.
Figure 21:
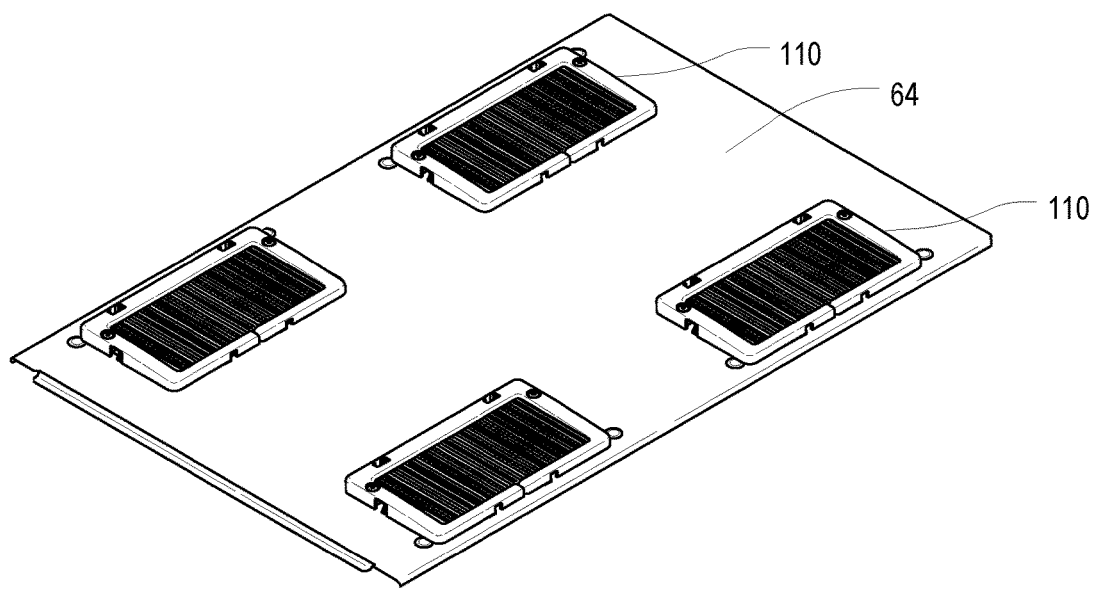
FIG. 21 is an isometric view of four of the larger brush port assemblies installed in a top panel in accordance with one or more preferred embodiments of the present invention.

As discussed herein, a brush port assembly 10 in accordance with one or more aspects of the present invention is installable in a wide variety of different structures in an electronic equipment enclosure. It is also contemplated that the size, shape, and configuration of the brush port assembly—including the bezel of the brush port assembly—can be varied to suit a particular installation environment. In this regard, FIG. 18 is a front isometric view of a larger brush port assembly having a one-piece split frame or bezel in accordance with one or more preferred embodiments of the present invention; FIG. 19 is an isometric view of two of the brush port assemblies 10 of FIG. 3 installed in a first vertical mounting rail 60 for an electronic equipment enclosure, and FIG. 20 is an isometric view of two larger brush port assemblies 110 installed in a second vertical mounting rail 160 for an electronic equipment enclosure, all in accordance with one or more preferred embodiments of the present invention. In another example, FIG. 21 is an isometric view of four of the larger brush port assemblies 110 installed in a top panel 64 for an electronic equipment enclosure in accordance with one or more preferred embodiments of the present invention.

Figure 22:
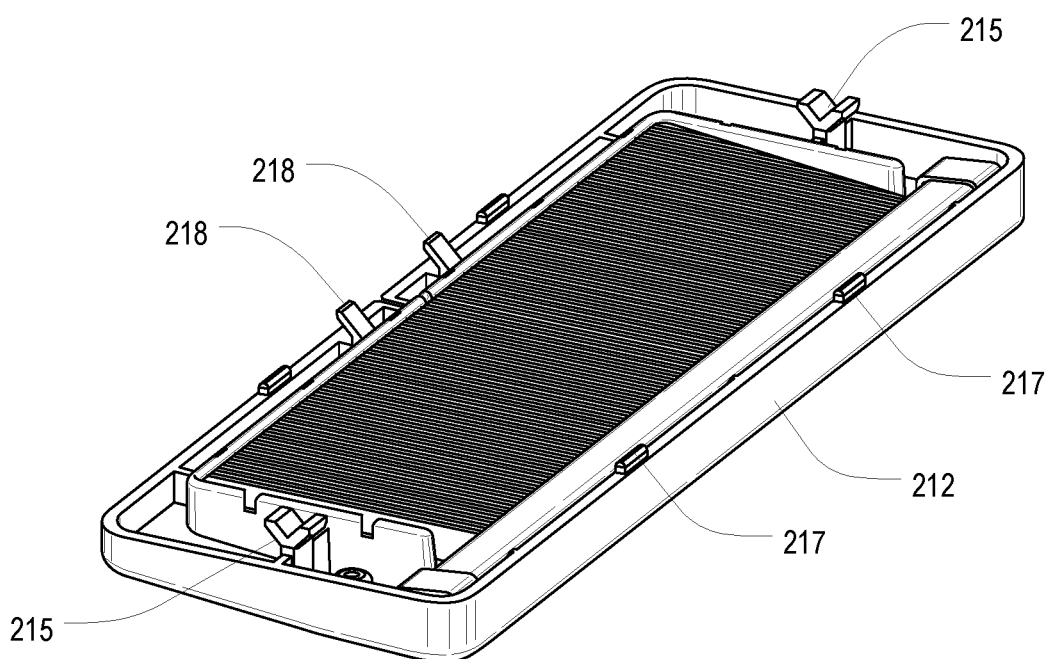
FIGS. 22 and 23 are rear views of other brush port assemblies having a one-piece split frame or bezel in accordance with one or more preferred embodiments of the present invention, each depicting Y-shaped snap features.
Figure 23:
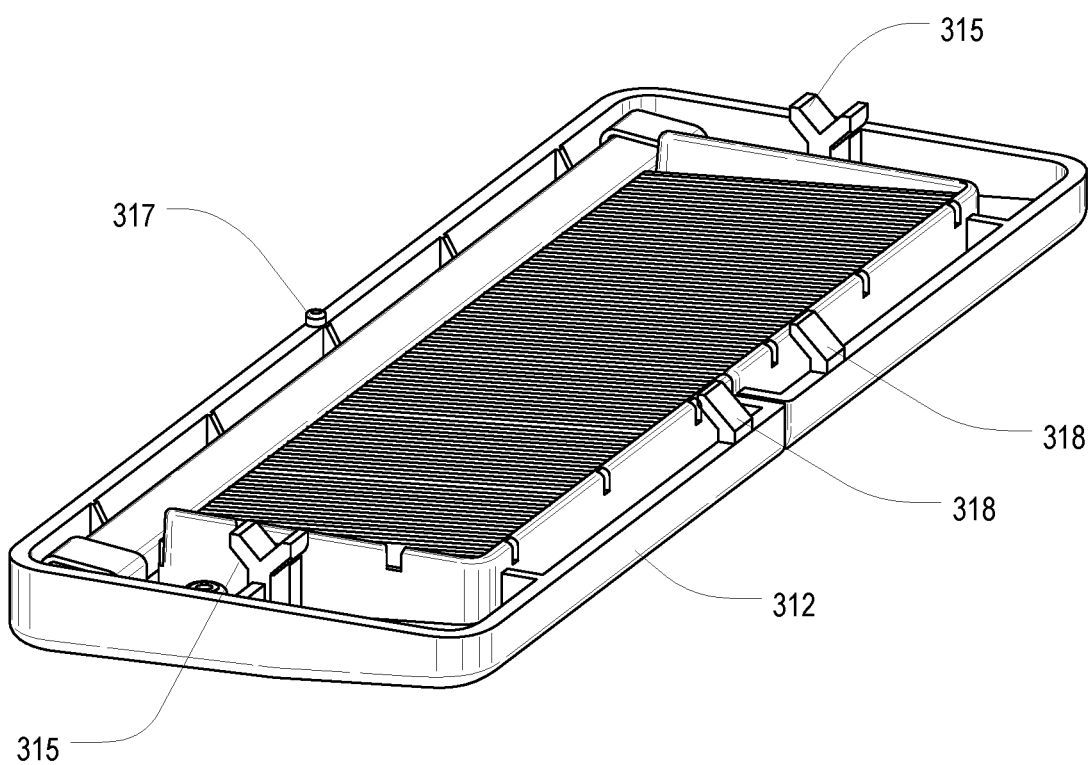

It is further contemplated that features to facilitate attachment of the brush port assembly at the edge or edges of an opening in an equipment enclosure can be configured or arranged in a variety of different ways. For example, FIGS. 22 and 23 are rear views of other brush port assemblies 210, 310 having a one-piece split frame or bezel 212, 312 in accordance with one or more preferred embodiments of the present invention, each depicting Y-shaped snap features 215, 315. In FIG. 22, the bezel 212 includes hooks 218 along one long edge and protrusions 217 arranged along the other long edge. The bezel 212 further includes a Y-shaped snap feature 215 along each short edge. In FIG. 23, the bezel 312 includes hooks 318 that extend inward at one long edge and a protrusion 317 along the other long edge. The bezel 312 further includes a Y-shaped snap feature 315 along each short edge.

Figure 24:
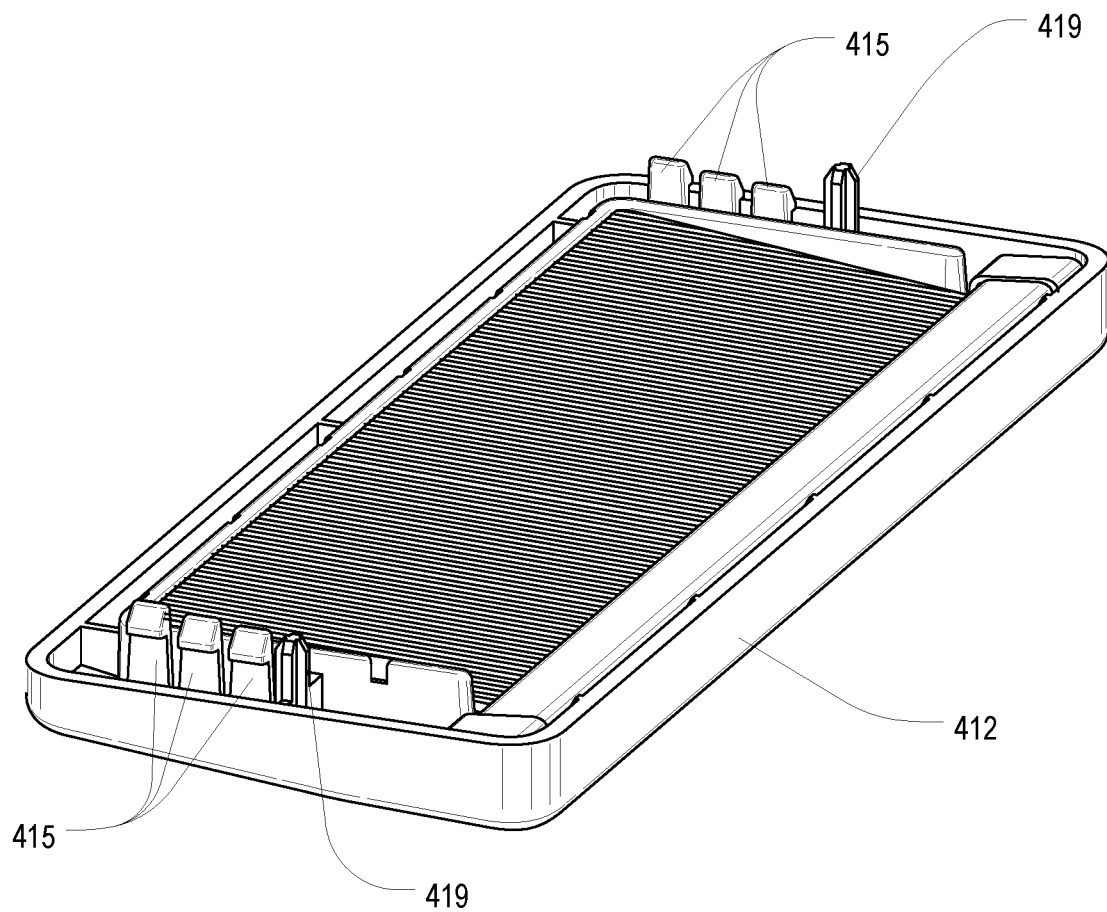
FIG. 24 is a rear view of another brush port assembly in accordance with one or more preferred embodiments of the present invention.

Further contemplated features to facilitate attachment of the brush port assembly are depicted in FIG. 24, which is a rear view of another brush port assembly 410 in accordance with one or more preferred embodiments of the present invention. In FIG. 24, the bezel 412 includes a row of snap features 415 of varying heights arranged adjacent a peg 419 along each short side thereof. Although not illustrated in FIG. 24, such an assembly 410 may likewise utilize a one-piece split frame or bezel.

Based on the foregoing information, it will be readily understood by those persons skilled in the art that the present invention is susceptible of broad utility and application. Many embodiments and adaptations of the present invention other than those specifically described herein, as well as many variations, modifications, and equivalent arrangements, will be apparent from or reasonably suggested by the present invention and the foregoing descriptions thereof, without departing from the substance or scope of the present invention.

Accordingly, while the present invention has been described herein in detail in relation to one or more preferred embodiments, it is to be understood that this disclosure is only illustrative and exemplary of the present invention and is made merely for the purpose of providing a full and enabling disclosure of the invention. The foregoing disclosure is not intended to be construed to limit the present invention or otherwise exclude any such other embodiments, adaptations, variations, modifications or equivalent arrangements; the present invention being limited only by the claim(s) appended hereto and the equivalents thereof.

What is claimed is:

1. A brush port assembly comprising:
    a bezel frame comprised of an elongate body having first and second ends, a top surface, and an underside, the elongate body being formed as a generally enclosed shape that frames an opening, whereby the first and second ends are arranged in an end-to-end relationship with a gap therebetween; and
    a brush component having a spine member from which a plurality of bristles extend, the spine member being secured to the underside of the elongate body such that the bristles substantially entirely cover the opening;
    wherein the bezel frame is installable, without the aid of tools, along an exposed edge of a brush port opening in a surface of an electronic equipment enclosure; and
    wherein the bezel frame is installable around a cable that passes through the brush port opening by maneuvering the cable through the gap.

2. The brush port assembly of claim 1, wherein the top surface of the elongate body is a smooth surface having rounded edges.

3. The brush port assembly of claim 1, further comprising one or more brush clamps, each of which is anchored to the underside of the elongate body with a separate fastener.

4. The brush port assembly of claim 1, wherein the bezel frame includes a plurality of hooks for hooking against the exposed edge of the brush port opening during installation.

5. The brush port assembly of claim 4, wherein each hook includes a proximal portion that extends downward from the underside of the elongate body and a distal portion that extends from the proximal portion at an angle downward and away from the opening.

6. The brush port assembly of claim 5, wherein the proximal portions extend downward from locations at the underside of the elongate body that are inset from an outer edge of the elongate body.

7. The brush port assembly of claim 1, wherein the bezel frame includes a plurality of deflectable tabs that extend downward from the underside of the elongate body, each of the deflectable tabs including a wedge at a distal end to facilitate snap-fitting of the bezel frame against the surface.

8. The brush port assembly of claim 1, wherein the bezel frame includes a sleeve that extends downward from an inner edge of the elongate body that enters into abutment with the exposed edge of the brush port opening during installation.

9. The brush port assembly of claim 1, wherein one or both of the first and second ends of the elongate body are deflectable to facilitate accommodation of the cable through the gap.

10. The brush port assembly of claim 1, wherein the generally enclosed shape is generally rectangular.

11. A brush port assembly comprising:
a bezel frame comprised of an elongate body having first and second ends, a top surface, and an underside, the elongate body being formed as a generally enclosed shape that frames an opening, whereby the first and second ends are arranged in an end-to-end relationship with a gap therebetween; and
a brush component having a spine member from which a plurality of bristles extend, the spine member being secured to the underside of the elongate body such that the bristles substantially entirely cover the opening;
wherein the bezel frame includes a plurality of hooks, each hook including a proximal portion that extends downward from the underside of the elongate body and a distal portion that extends from the proximal portion at an angle downward and away from the opening; and
wherein the bezel frame includes a plurality of deflectable tabs that extend downward from the underside of the elongate body, each of the deflectable tabs including a wedge at a distal end.

12. The brush port assembly of claim 11, wherein the top surface of the elongate body is a smooth surface having rounded edges.

13. The brush port assembly of claim 11, further comprising one or more brush clamps, each of which is anchored to the underside of the elongate body with a separate fastener.

14. The brush port assembly of claim 11, wherein the proximal portions extend downward from locations at the underside of the elongate body that are inset from an outer edge of the elongate body.

15. The brush port assembly of claim 11, wherein the bezel frame includes a sleeve that extends downward from an inner edge of the elongate body.

16. The brush port assembly of claim 11, wherein one or both of the first and second ends of the elongate body are deflectable.

17. The brush port assembly of claim 11, wherein the generally enclosed shape is generally rectangular.

* * * * *